(12) United States Patent
Huang et al.

(10) Patent No.: US 11,145,564 B2
(45) Date of Patent: Oct. 12, 2021

(54) MULTI-LAYER PASSIVATION STRUCTURE AND METHOD

(71) Applicant: Taiwan Semiconductor Manufacturing Co., Ltd., Hsin-Chu (TW)

(72) Inventors: Chih-Fan Huang, Kaohsiung (TW); Hui-Chi Chen, Hsinchu County (TW); Kuo-Chin Chang, Chiayi (TW); Dian-Hau Chen, Hsinchu (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/395,435

(22) Filed: Apr. 26, 2019

(65) Prior Publication Data

US 2020/0006183 A1    Jan. 2, 2020

Related U.S. Application Data

(60) Provisional application No. 62/691,683, filed on Jun. 29, 2018.

(51) Int. Cl.
| | |
|---|---|
| H01L 23/31 | (2006.01) |
| H01L 23/29 | (2006.01) |
| H01L 23/00 | (2006.01) |
| H01L 21/56 | (2006.01) |

(52) U.S. Cl.
CPC ........ H01L 23/3192 (2013.01); H01L 21/563 (2013.01); H01L 23/291 (2013.01); H01L 23/3171 (2013.01); H01L 24/08 (2013.01); H01L 24/16 (2013.01); *H01L 2224/0401* (2013.01)

(58) Field of Classification Search
CPC . H01L 23/3192; H01L 21/563; H01L 23/291; H01L 23/3171; H01L 24/08; H01L 24/16
See application file for complete search history.

(56) References Cited

U.S. PATENT DOCUMENTS

| | | | | |
|---|---|---|---|---|
| 5,616,933 | A * | 4/1997 | Li | ......................... H01L 23/291 257/347 |
| 5,795,833 | A * | 8/1998 | Yu | ..................... H01L 21/02164 257/E21.279 |
| 8,941,218 | B1 * | 1/2015 | Perkins | ............. H01L 21/02241 257/635 |
| 9,000,584 | B2 | 4/2015 | Lin et al. | |
| 9,048,222 | B2 | 6/2015 | Hung et al. | |

(Continued)

*Primary Examiner* — Nathan W Ha
(74) *Attorney, Agent, or Firm* — Haynes and Boone, LLP

(57) ABSTRACT

Semiconductor devices, integrated circuits and methods of forming the same are provided. In one embodiment, a method for integrated circuit (IC) fabrication includes forming a passivation layer over a first contact feature, forming a second contact feature over and through the passivation layer to electrically connect to the first contact feature, and forming a multi-layer passivation structure over the second contact feature and over the passivation layer. Forming the multi-layer passivation structure includes depositing a first nitride layer, an oxide layer over the first nitride layer, and a second nitride layer over the oxide layer.

20 Claims, 22 Drawing Sheets

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,741,477 B2* | 8/2020 | Yang ................... H01L 23/481 |
| 2005/0104068 A1* | 5/2005 | Yamazaki ........... H01L 27/1222 257/66 |
| 2007/0075372 A1* | 4/2007 | Terashima .......... H01L 29/7854 257/360 |
| 2007/0176175 A1* | 8/2007 | Shioga ................... H01G 4/228 257/40 |
| 2008/0194095 A1* | 8/2008 | Daubenspeck ..... H01L 23/3192 438/612 |
| 2010/0224960 A1* | 9/2010 | Fischer ............... H01L 23/5223 257/532 |
| 2013/0043583 A1* | 2/2013 | Wu ........................ H01L 24/11 257/737 |
| 2013/0270675 A1* | 10/2013 | Childs ................ H01L 23/5226 257/532 |
| 2014/0225160 A1* | 8/2014 | Clifton ............. H01L 29/66477 257/190 |
| 2014/0252621 A1* | 9/2014 | Lin ................... H01L 21/76807 257/751 |
| 2015/0021672 A1* | 1/2015 | Chuang ........... H01L 21/823821 257/288 |
| 2017/0250147 A1* | 8/2017 | Yu ........................... H01L 24/13 |
| 2017/0372983 A1* | 12/2017 | Howard ............. H01L 27/1203 |
| 2018/0068894 A1* | 3/2018 | Mukherjee ............. H01L 23/18 |
| 2018/0108588 A1* | 4/2018 | Aoike ............... H01L 21/02164 |
| 2018/0108589 A1* | 4/2018 | Aoike ................ H01L 23/3171 |
| 2019/0067149 A1* | 2/2019 | Wang ............... H01L 21/02131 |
| 2019/0123150 A1* | 4/2019 | MacDonald ........ H01L 23/3171 |
| 2020/0035596 A1* | 1/2020 | Kao ................... H01L 21/02554 |
| 2020/0243412 A1* | 7/2020 | Wang ............... H01L 21/76895 |

* cited by examiner

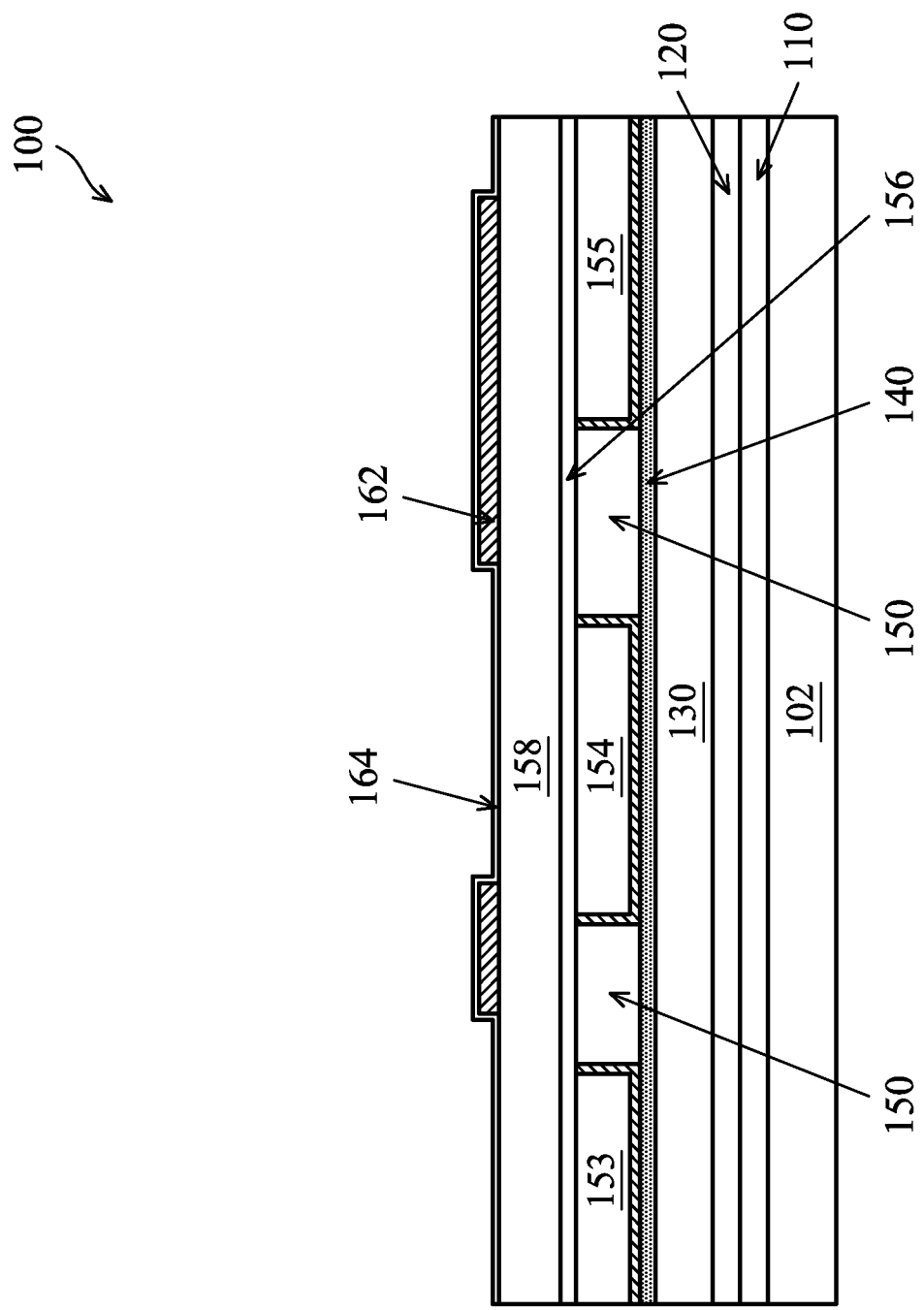

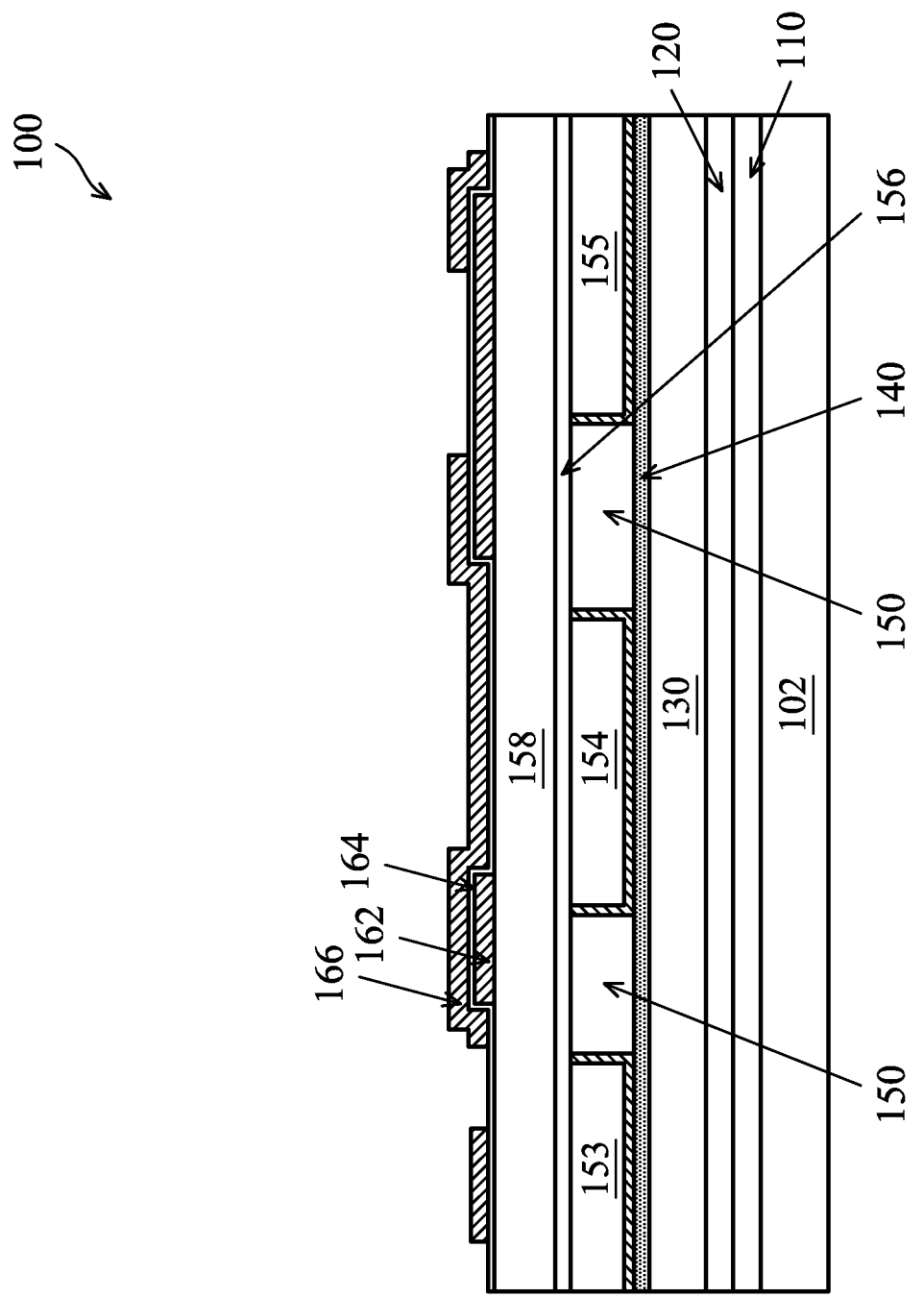

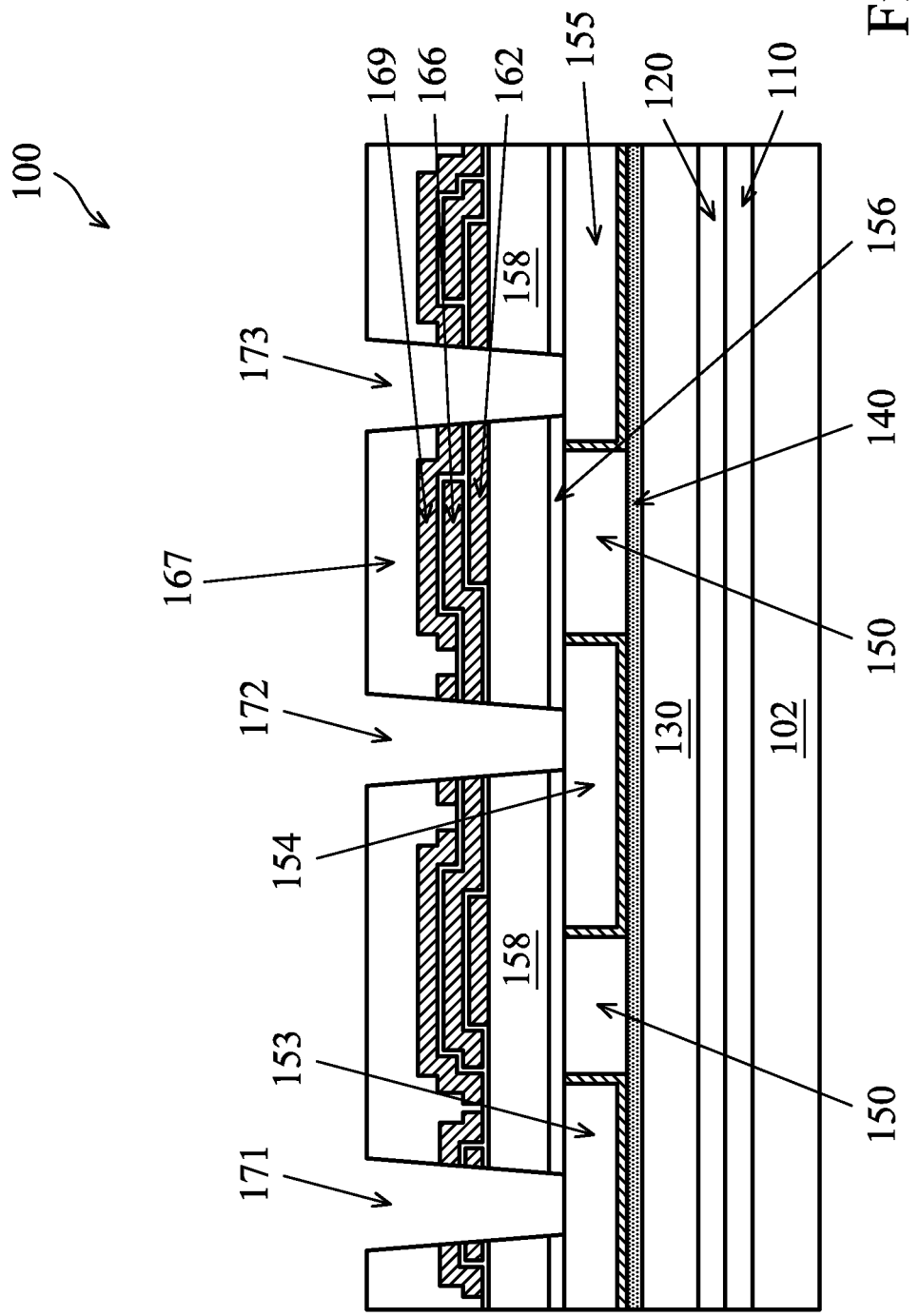

MULTI-LAYER PASSIVATION STRUCTURE AND METHOD

PRIORITY DATA

This application claims priority to U.S. Provisional Patent Application Ser. No. 62/691,683 filed Jun. 29, 2018, and entitled "Tri-Layer Passivation Structure on Redistribution Layer for Stress Relief," the entire disclosure of which is hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

For example, ICs are formed on a semiconductor substrate. Each IC chip is further attached (such as by bonding) to a circuit board, such as a printed circuit board in electronic products. In previous technologies, various bonding pads of the chip are connected to the circuit board through wire bonding. In advanced technologies, a circuit chip is flipped and directly bonded to the circuit board for reduced cost. In this technology, a redistribution layer (RDL) of conductive metal lines is formed on the chip to reroute bond connections from the edge to the center of the chip. A passivation layer is coupled to the RDL to protect the semiconductor surface from electrical and chemical contaminants. However, some passivation layers are prone to stress and cracks and may lead to potential voids between adjacent metal contacts. Therefore, although existing passivation layers and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, 2F, 2G, 2H, 2I, 2J, 2K, 2L, 2M, 2N, 2O, 2P, 2Q, 2R, 2S, 2T, and 2U are cross-sectional views of a semiconductor device at various stages of fabrication according to embodiments of the present disclosure.

DETAILED DESCRIPTION

Figure 1:
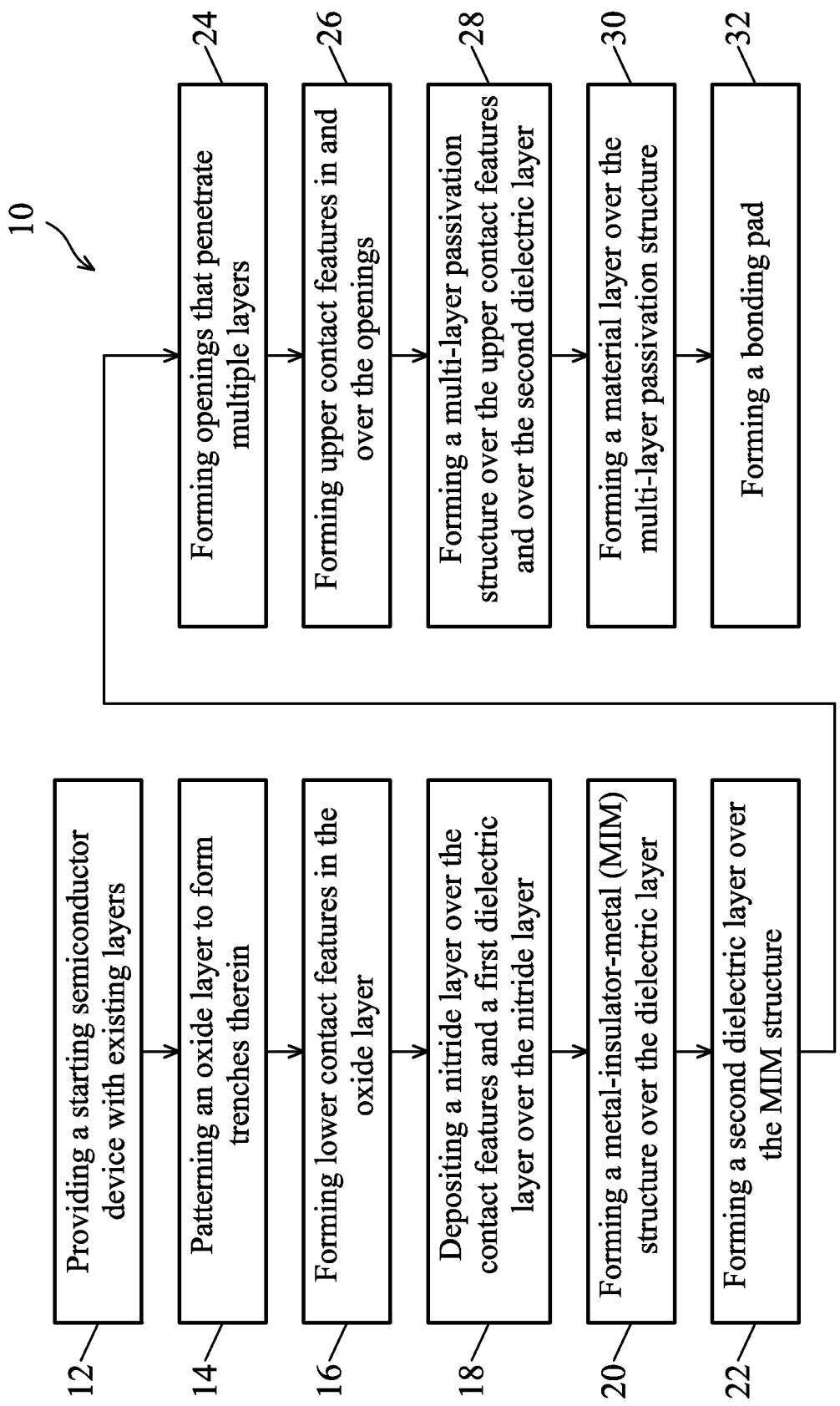
FIG. 1 is a flow chart of a method for fabricating a semiconductor device in accordance with embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

On many IC chips, a redistribution layer (RDL) of conductive metal lines is formed to reroute bond connections from the edge to the center of the chip. A passivation layer is coupled to the RDL to protect the semiconductor surface from electrical and chemical contaminants. However, some passivation layers use a single layer made of brittle materials, which are prone to stress and cracks.

The present disclosure provides a multi-layer passivation structure and methods of making the same to address these issues. In some embodiments, instead of having a single passivation layer, a passivation structure has at least three layers, for example, including two silicon nitride (SiN) layers and an oxide layer sandwiched therebetween. As an example, forming the tri-layer passivation structure on a RDL may include depositing a first SiN layer via chemical vapor deposition (CVD) or physical vapor deposition (PVD), depositing an oxide layer via high density plasma (HDP) deposition on the first SiN layer, and depositing a second SiN layer via CVD or PVD on the oxide layer. Since the oxide layer is less brittle than the SiN layers, the tri-layer passivation structure is less prone to cracks and stress buildup. As such, the resulting semiconductor device has better reliability and/or enhanced performance.

The various aspects of the present disclosure will now be described in more detail with reference to the figures. In that regard, FIG. 1 is a flowchart illustrating a method 10 for fabricating a semiconductor device 100 according to embodiments of the present disclosure. The method 10 is merely an example and is not intended to limit the present disclosure to what is explicitly illustrated in the method 10. Additional steps can be provided before, during, and after the method 10, and some steps described can be replaced, eliminated, or moved around for additional embodiments of the method. Not all steps are described herein in detail for reasons of simplicity. The method 10 is described below in conjunction with FIGS. 2A-2U, which are diagrammatic fragmentary cross-sectional views of the semiconductor device 100 at different stages of fabrication according to embodiments of the present disclosure.

Figure 2A:
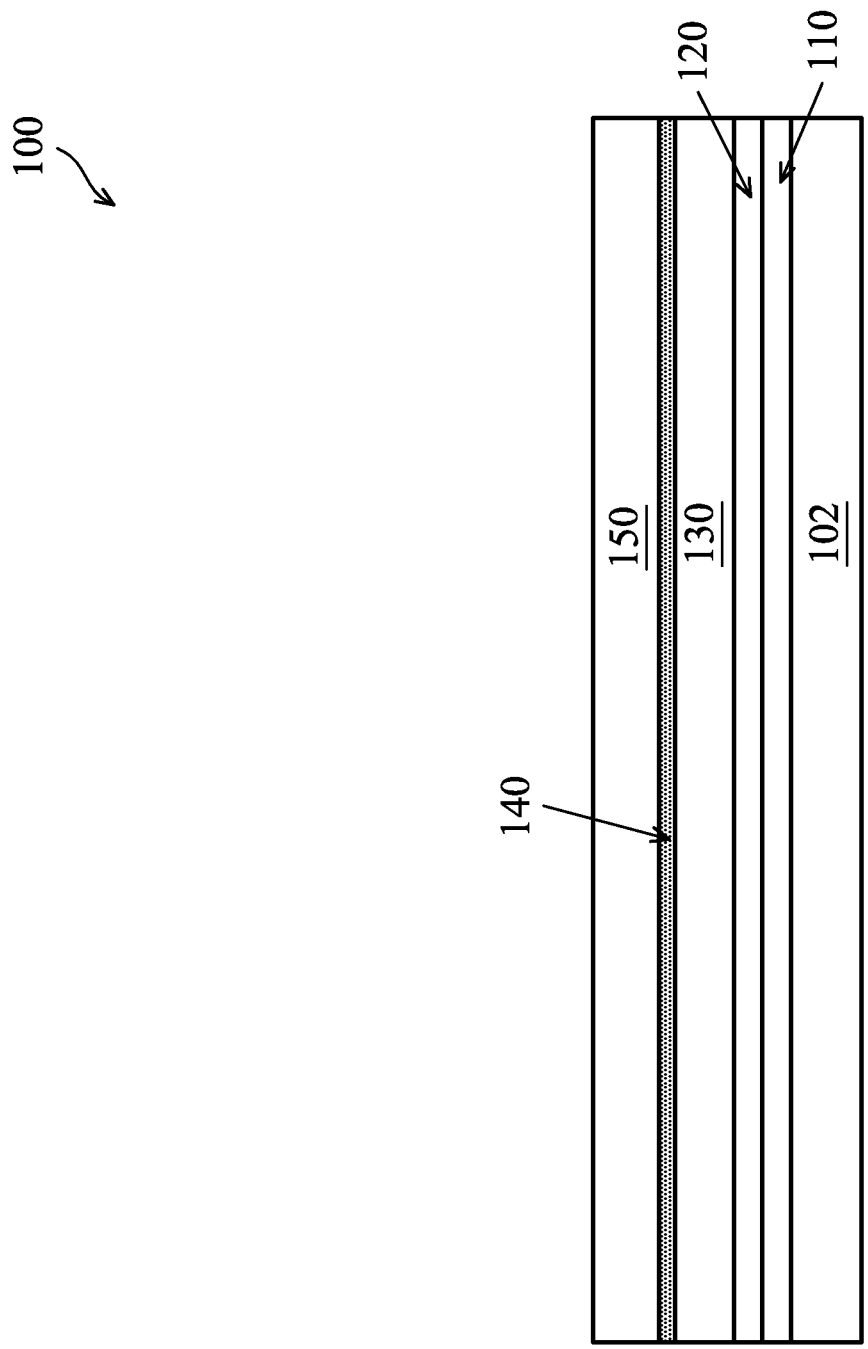

At the beginning of the method 10 (FIG. 1), in step 12, a starting semiconductor device (or semiconductor structure) 100 is provided with various layers already formed thereon. Referring to FIG. 2A, the starting semiconductor device 100 includes a substrate 102, which may be made of silicon or other semiconductor materials such as germanium. The substrate 102 also may comprise a compound semiconductor such as silicon carbide, gallium arsenic, indium arsenide, or indium phosphide. In some embodiments, the substrate 102 may comprise alloy semiconductor such as silicon germanium, silicon germanium carbide, gallium arsenic phosphide, or gallium indium phosphide. In some embodiments, the substrate 102 may include an epitaxial layer, for example an epitaxial layer overlying a bulk semiconductor. Various microelectronic components may be formed in or on the substrate 102, such as transistor components including source/drain and/or gate, isolation structures including shallow trench isolation (STI), or any other suitable components.

The semiconductor device 100 also includes an interconnect layer 110. The interconnect layer 110 may be one of the interconnect layers in a multi-layered interconnect (MLI) structure, which is formed over the substrate 102 and may include multiple patterned dielectric layers and conductive layers that provide interconnections (e.g., wiring) between the various microelectronic components of the semiconductor device 100. There may be intermediate layers or components between the interconnect layer 110 and the substrate 102, but in the interest of simplicity such layers or components are not shown. In an embodiment, the interconnect layer 110 is about 169 to about 230 nanometers (nm) thick.

The interconnect layer 110 may include multiple conductive components as well as an interlayer dielectric (ILD) component that partially or fully surrounds the conductive components. The conductive components may include contacts, vias, or metal lines. The ILD component may be a silicon-containing dioxide material where silicon exists in various suitable forms. As an example, the ILD component includes silicon dioxide or a low-k dielectric material whose k-value (dielectric constant) is smaller than that of silicon dioxide, which is about 4. In some embodiments, the low-k dielectric material includes a porous organosilicate thin film such as SiOCH, tetraethylorthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

In an embodiment, a carbide layer 120 is deposited on the interconnect layer 110. The deposition process includes chemical vapor deposition (CVD), physical vapor deposition (PVD), atomic layer deposition (ALD), or combinations thereof. In some embodiments, the carbide layer 120 has a generally uniform thickness of between about 45 nm and about 70 nm. Any suitable type of carbide material such as silicon carbide (SiC) can be used in the carbide layer 120.

In an embodiment, an oxide layer 130 is deposited on the carbide layer 120. Any suitable deposition process may be used, including CVD, PVD, ALD, or combinations thereof. In some embodiments, the oxide layer 130 includes undoped silicon dioxide. In an embodiment, the interconnect layer 110, the carbide layer 120 and the oxide layer 130 may be replaced with one or more interconnect structures.

In an embodiment, an etch stop layer (ESL) 140 is deposited on the oxide layer 130. In some embodiments, the ESL 140 is about 45 to about 55 nm thick. The ESL 140 may include silicon carbon nitride (SiCN), silicon oxycarbide (SiOCN), silicon carboxide (SiC), or silicon nitride (SiN), or combinations thereof.

Another oxide layer 150 may be deposited on the etch stop layer 140. In some embodiments, the oxide layer 150 includes undoped silicon dioxide. In some embodiments, the oxide layer 150 is about 800 to about 1000 nm thick.

Figure 2B:
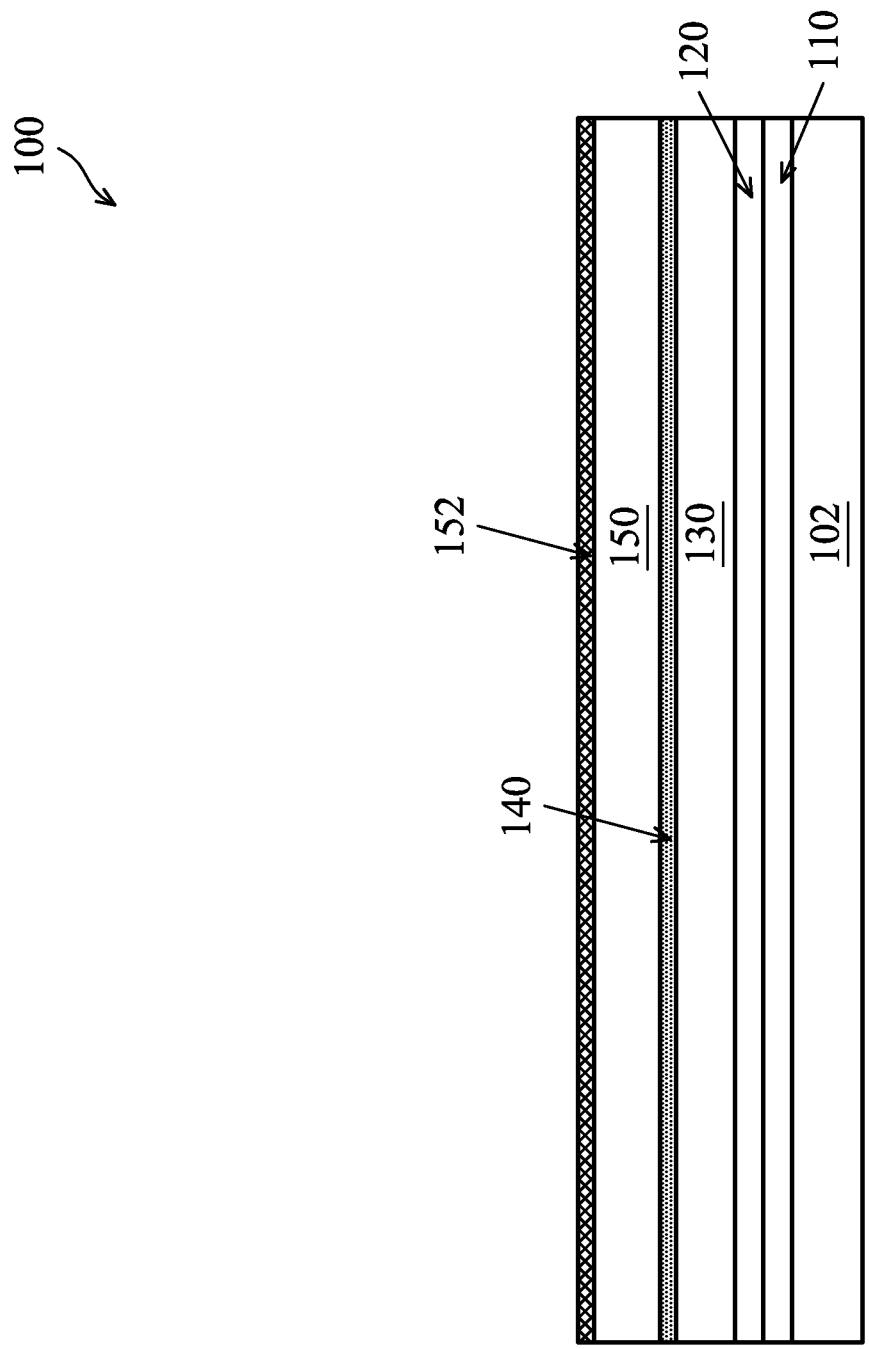
Figure 2C:
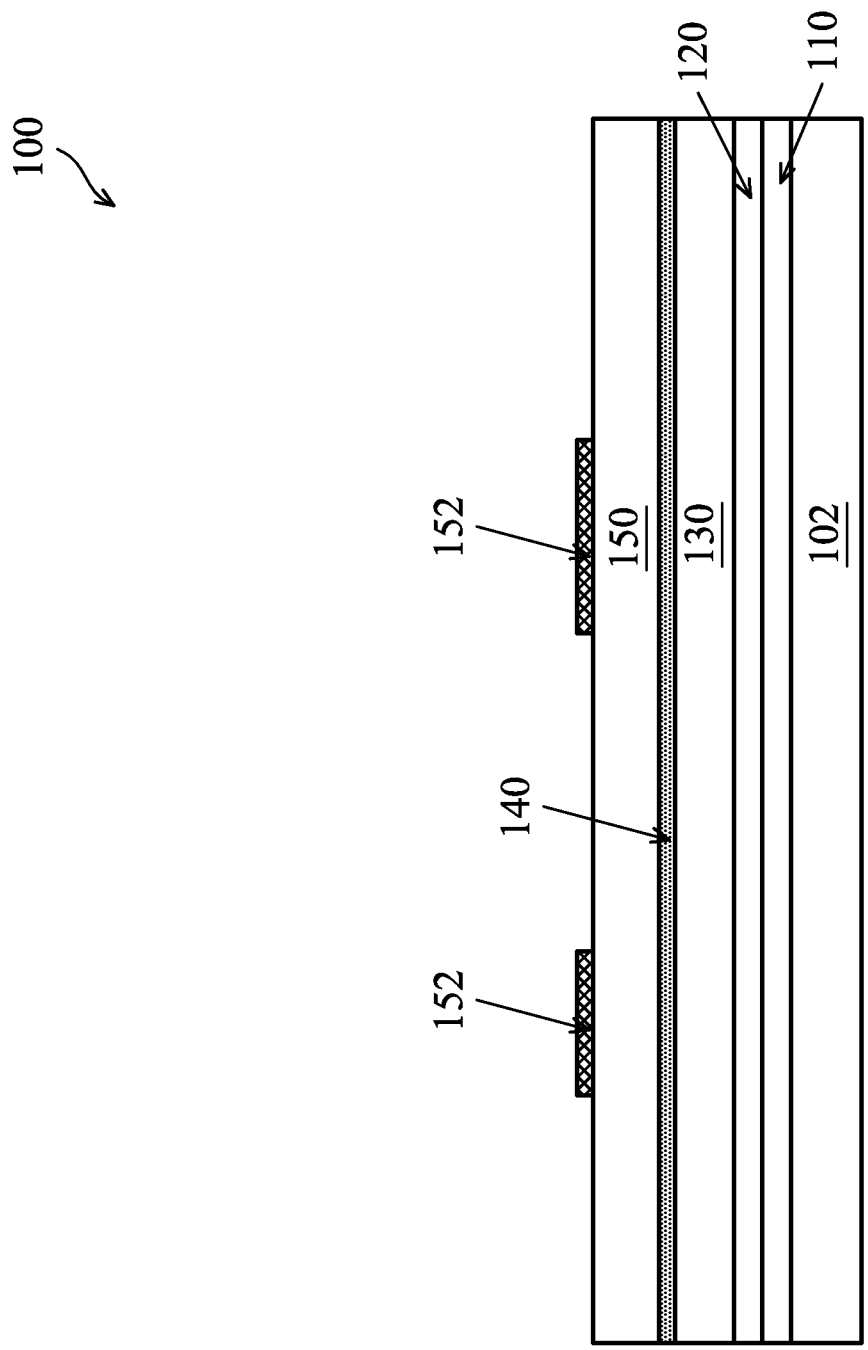
Figure 2D:
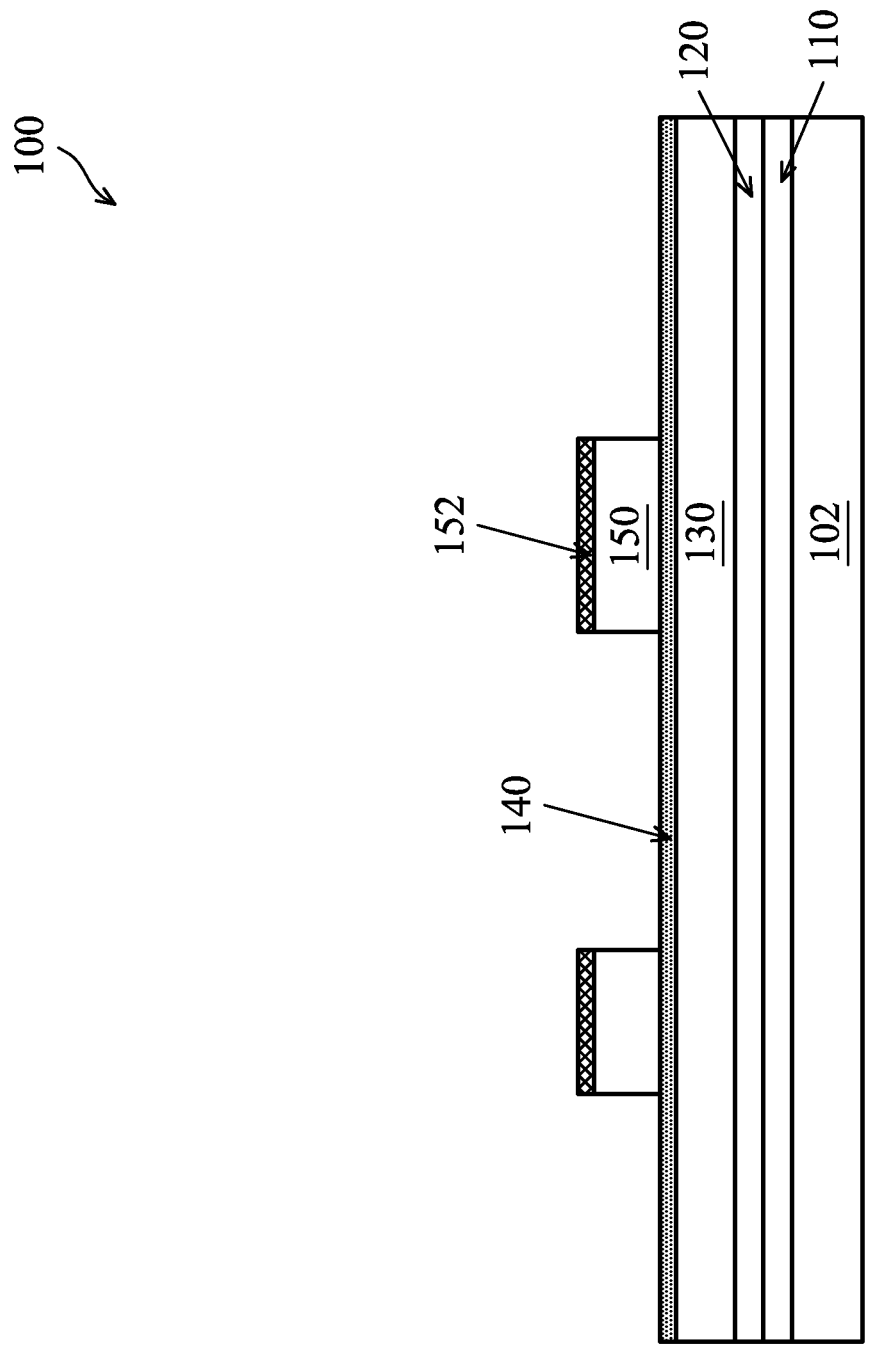
Figure 2E:
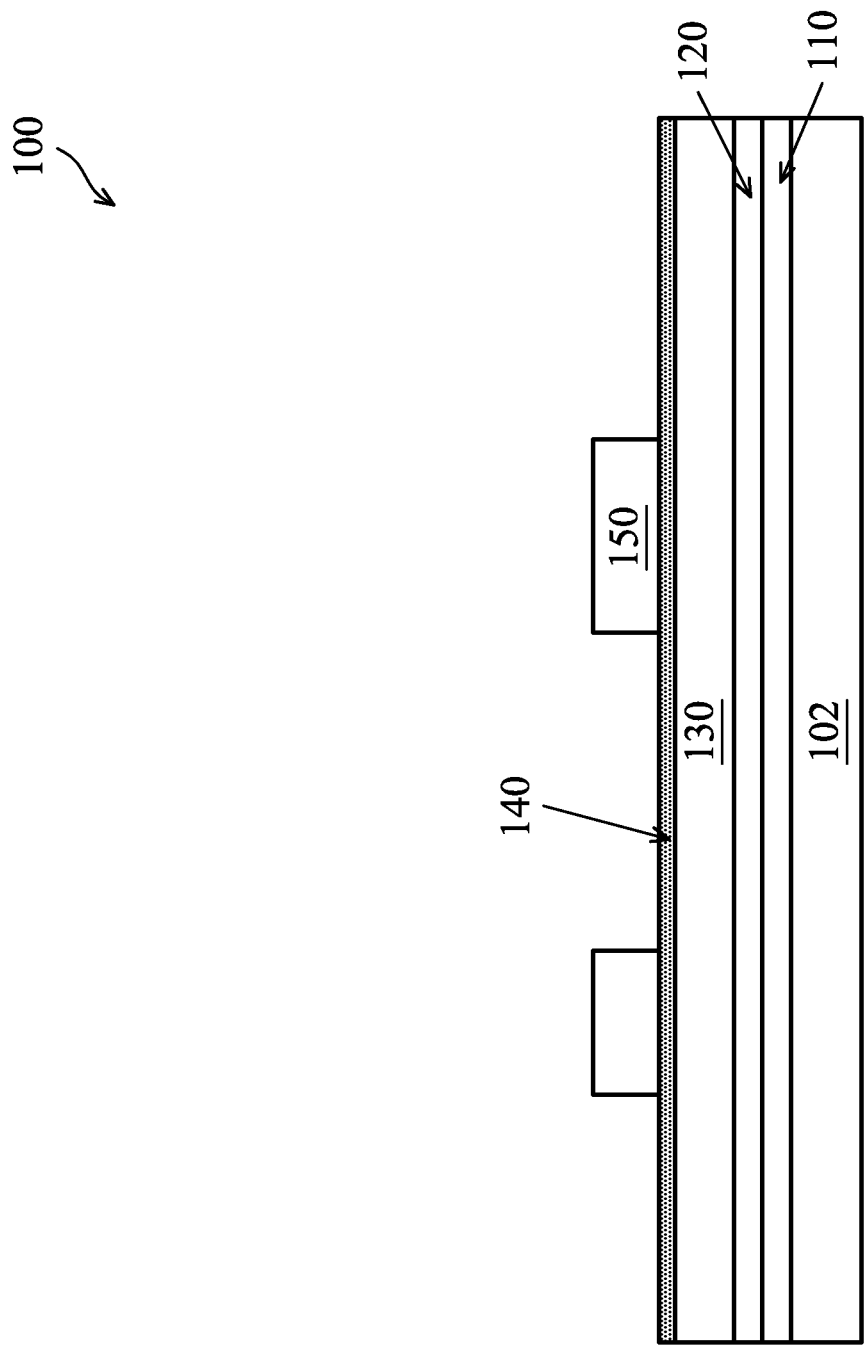

Next, in step 14 of the method 10 (FIG. 1), the oxide layer 150 is patterned to form trenches therein. Referring to FIGS. 2B-2E, patterning the oxide layer 150 involves multiple processes. As shown in FIG. 2B, a silicon oxide nitride (SiON) layer 152 is deposited on the oxide layer 150. In some embodiments, the SiON layer 152 is about 54 to about 66 nm thick. As shown in FIG. 2C, the SiON layer 152 is patterned, for example, using a photolithography process. As shown in FIG. 2D, the oxide layer 150 is etched to form trenches therein using the SiON layer 152 an etch mask. As shown in FIG. 2E, the SiON layer 152 after being used as an etch mask is removed, leaving a patterned oxide layer 150.

Figure 2F:
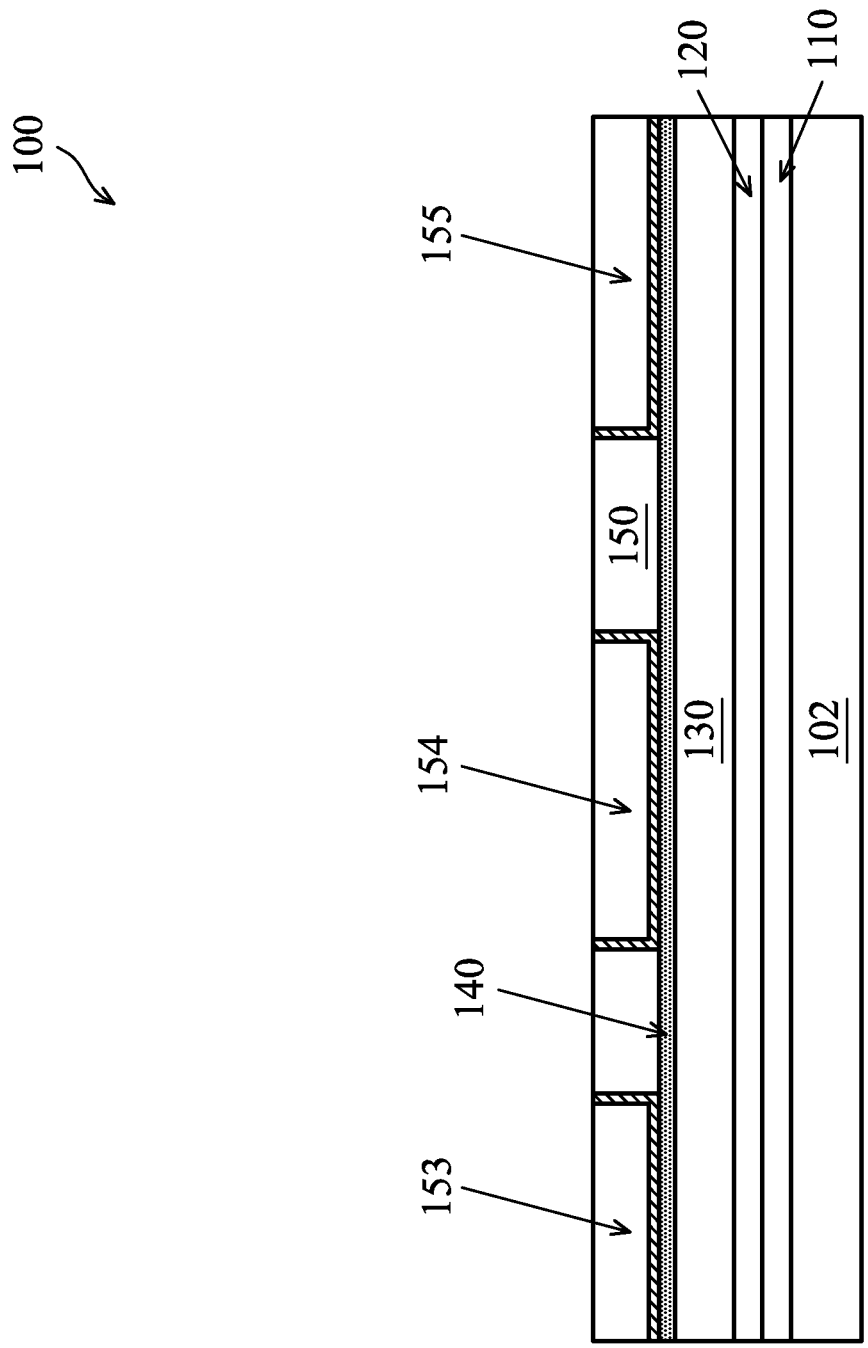

Referring to FIG. 2F, in step 16 of the method 10 (FIG. 1), one or more lower contact features (such as 153, 154, and 155) are formed in the trenches of the oxide layer 150. Although the contact features 153, 154, and 155 are disposed at a low position (compared to other contact features discussed below), the contact features 153, 154, and 155 are sometimes referred to as top metal (TM) contacts because they may reside above transistor features (not shown in figures herein). Further, contact features are sometimes referred to as metal contacts, vias, or metal lines. Each of the contact features may include a barrier layer and a metal fill layer. Therefore, forming the contact features 153, 154, and 155 involves multiple processes. In some embodiments, a barrier layer is formed in each metal contact, followed by the formation of a metal fill layer on the barrier layer. In some embodiments, the barrier layer includes titanium nitride, tantalum, tantalum nitride, or combinations thereof. In some embodiments, the metal fill layer includes a metal or metal alloy such as copper, cobalt, nickel, aluminum, tungsten, titanium, or combinations thereof. In some embodiments, the metal fill layer is formed by deposition or plating, followed by a chemical mechanical planarization (CMP) process. In an embodiment, about 5% to about 10% of the thickness of the oxide layer 150 is also removed by the CMP process.

Figure 2G:
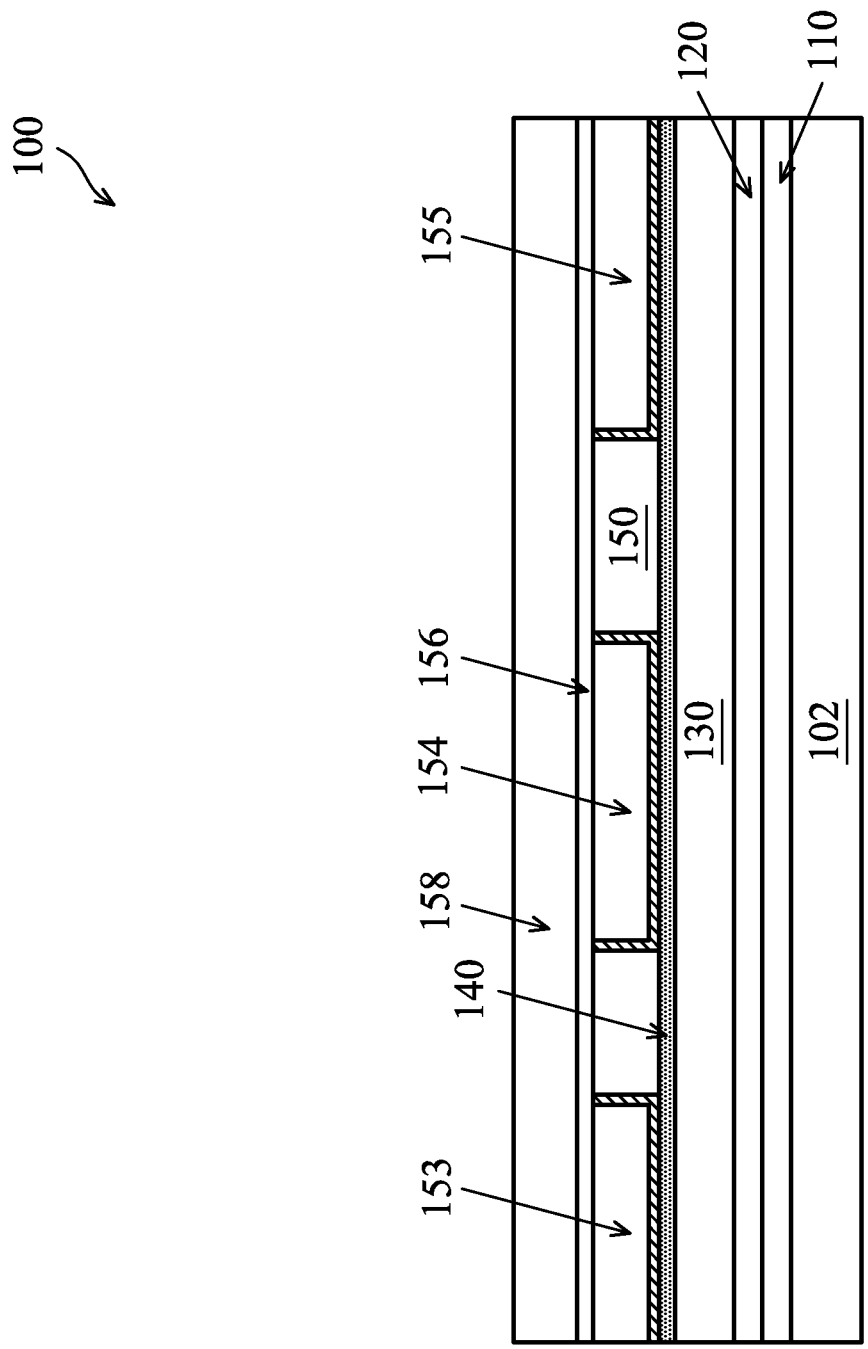

Referring to FIG. 2G, in step 18 of the method 10 (FIG. 1), a nitride layer 156 is deposited over the contact features 153, 154, and 155. In some embodiments, the nitride layer 156 is about 65 to about 85 nm thick. The nitride layer 156 may include silicon carbon nitride (SiCN), silicon nitride (SiN), and/or other suitable materials that may protect the contact features 153, 154, and 155 from being oxidized. Also in step 18, a dielectric layer 158 is deposited over the nitride layer 156. In some embodiments, the dielectric layer 158 is about 300 to about 500 nm thick. The dielectric layer 158 may include an oxide material, such as undoped silicon dioxide, or other suitable material(s).

Figure 2H:
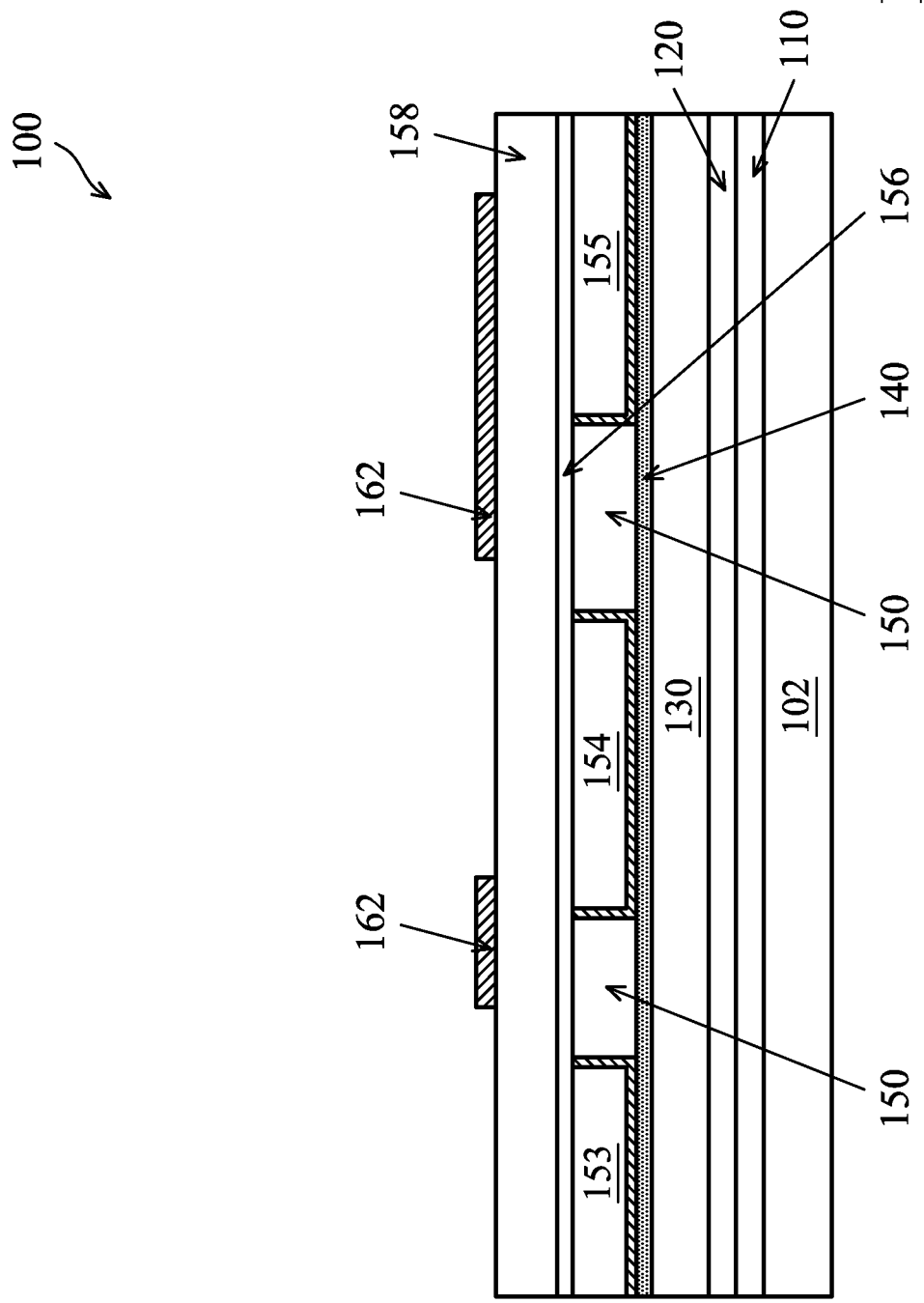
Figure 2K:
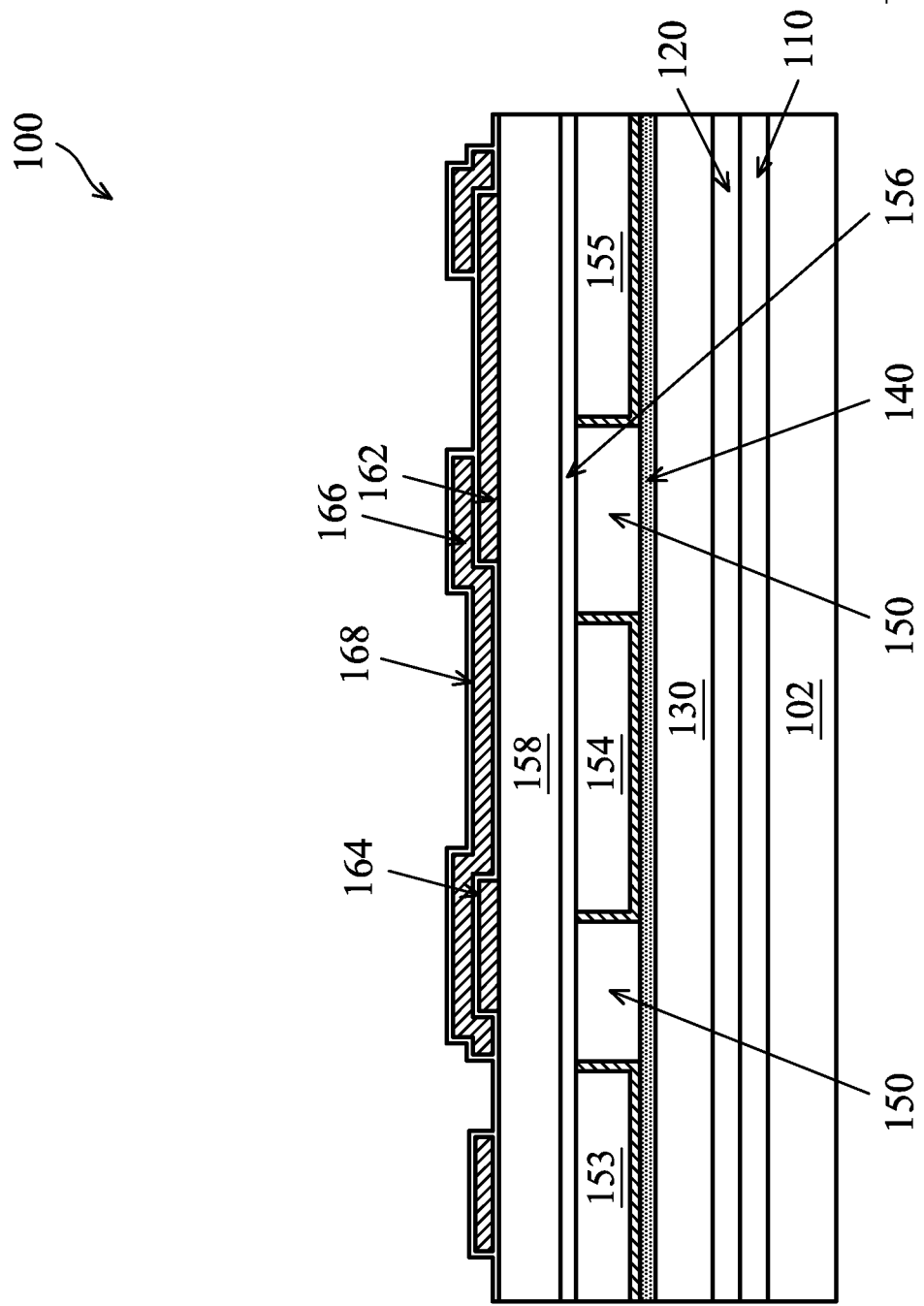
Figure 2L:
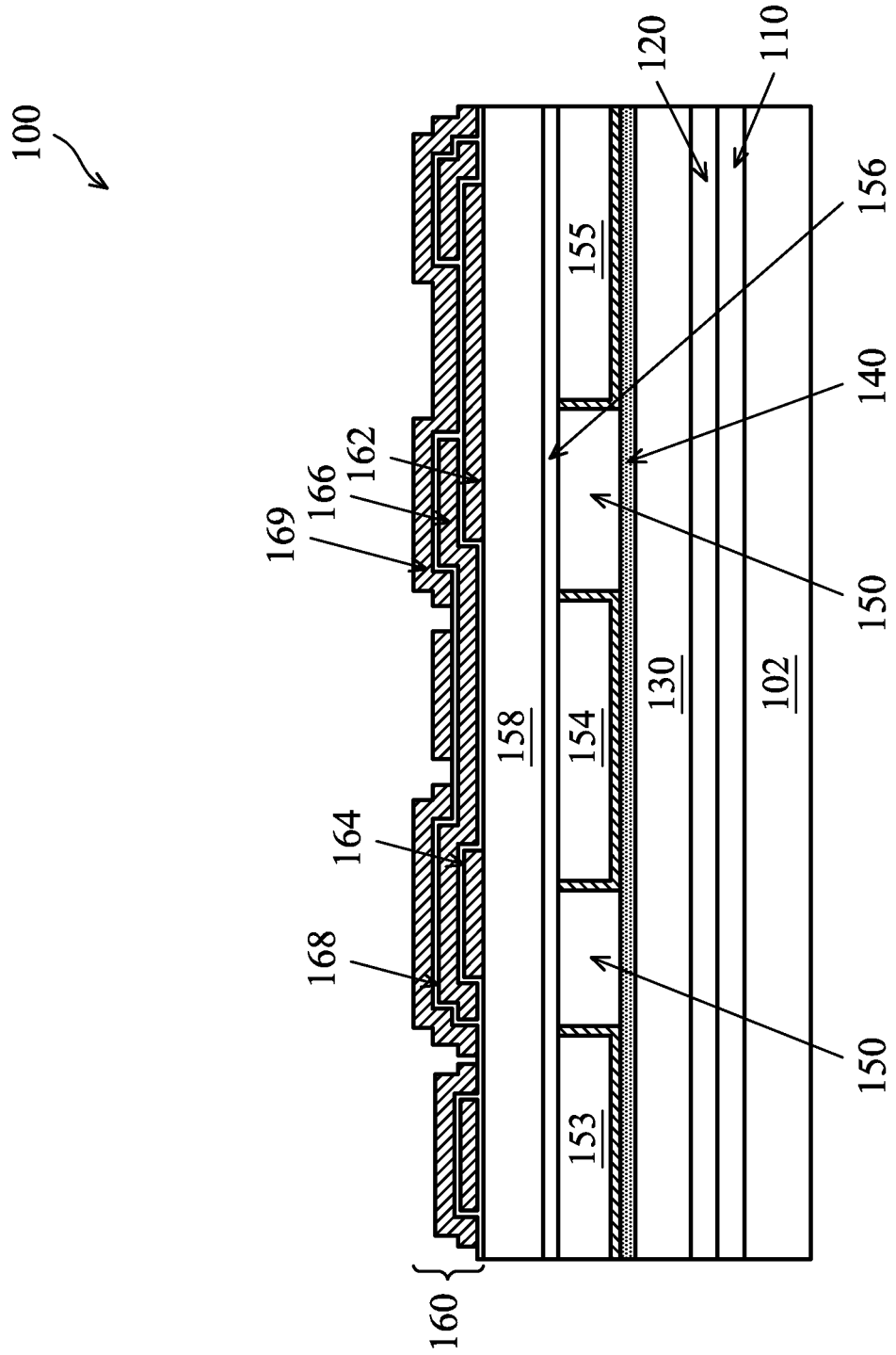

In step 20 of the method 10 (FIG. 1), a metal-insulator-metal (MIM) structure 160 is formed over the dielectric layer 158. Referring to FIGS. 2H-2L, forming the MIM structure 160 involves multiple processes. As shown in FIG. 2H, a patterned capacitor bottom metal (CBM) layer 162 is formed on the dielectric layer 158. Forming the CBM layer 162 itself may involve multiple processes such as deposition, photolithography, development, and/or etching, etc. The CBM layer 162 may go through surface treatment such as sidewall passivation using a nitrous oxide (N2O) gas. In some embodiments, the CBM layer 162 is about 35 to about 45 nm thick. As shown in FIG. 2I, a first dielectric layer 164 is formed on the CBM layer 162. In an embodiment, the dielectric layer 164 is deposited to have a generally uniform thickness over the top surface of the semiconductor device 100 (e.g., having about the same thickness on top and sidewall surfaces of the CBM layer 162). As shown in FIG. 2J, a patterned capacitor middle metal (CMM) layer 166 is formed on the dielectric layer 164. The CMM layer 166 may be formed similarly to the CBM layer 162, but the pattern of the CMM layer 166 may be different from that of the CBM layer 162. As shown in FIG. 2K, a second dielectric layer 168 is formed on the CMM layer 166. In an embodiment, the dielectric layer 168 is deposited to have a generally uniform thickness over the top surface of the semiconductor device 100 (e.g., having about the same thickness on top and sidewall surfaces of the CMM layer 166). As shown in FIG. 2L, a patterned capacitor top metal (CTM) layer 169 is formed on the dielectric layer 168. The CTM layer 169 may be formed similarly to the CMM layer 166 or the CBM layer 162, but the pattern of the CTM layer 169 may be different from that of the CMM layer 166 or the CBM layer 162.

As shown in FIG. 2L, after formation the MIM structure 160 includes multiple metal layers including the CBM layer 162, the CMM 166, and the CTM 169, which function as metal plates of capacitors. The MIM structure 160 also includes multiple dielectric layers including the dielectric layer 164 disposed between the CBM layer 162 and the CMM layer 166, as well as the dielectric layer 168 disposed between the CMM layer 166 and the CTM layer 169. The MIM structure 160 is used to implement one or more capacitors, which may be connected to other electric components such as transistors (planar or FinFET, not shown in figures). The multi-layer MIM structure 160 allows capacitors to be closely packed together in both vertical and lateral directions, thereby reducing the amount of lateral space needed for implementing capacitors. As a result, the MIM structure 160 may accommodate super high density capacitors.

In some embodiments, to increase capacitance values, the dielectric layer 164 and/or the dielectric layer 168 use high-k dielectric material(s) whose k-value is bigger than that of silicon dioxide. The dielectric layers 164 and 168 may be relatively thin to increase capacitance values, but dielectric layers 164 and 168 maintain minimal thicknesses to avoid potential breakdown of the capacitors in the MIM structure 160 (e.g., when two capacitor plates have high potential difference, current may leak between the plates, causing breakdown). In some embodiments, the dielectric layer 164 or 168 is about 50 to about 70 nm thick. Further, to optimize the capacitor performance, in some embodiments, the dielectric layer 164 (or 168) is a tri-layer structure including, from bottom to top, a first $ZrO_2$ layer, an $Al_2O_3$ layer, and a second $ZrO_2$ layer, where each of the layers is about 15 to about 25 nm thick.

Figure 2M:
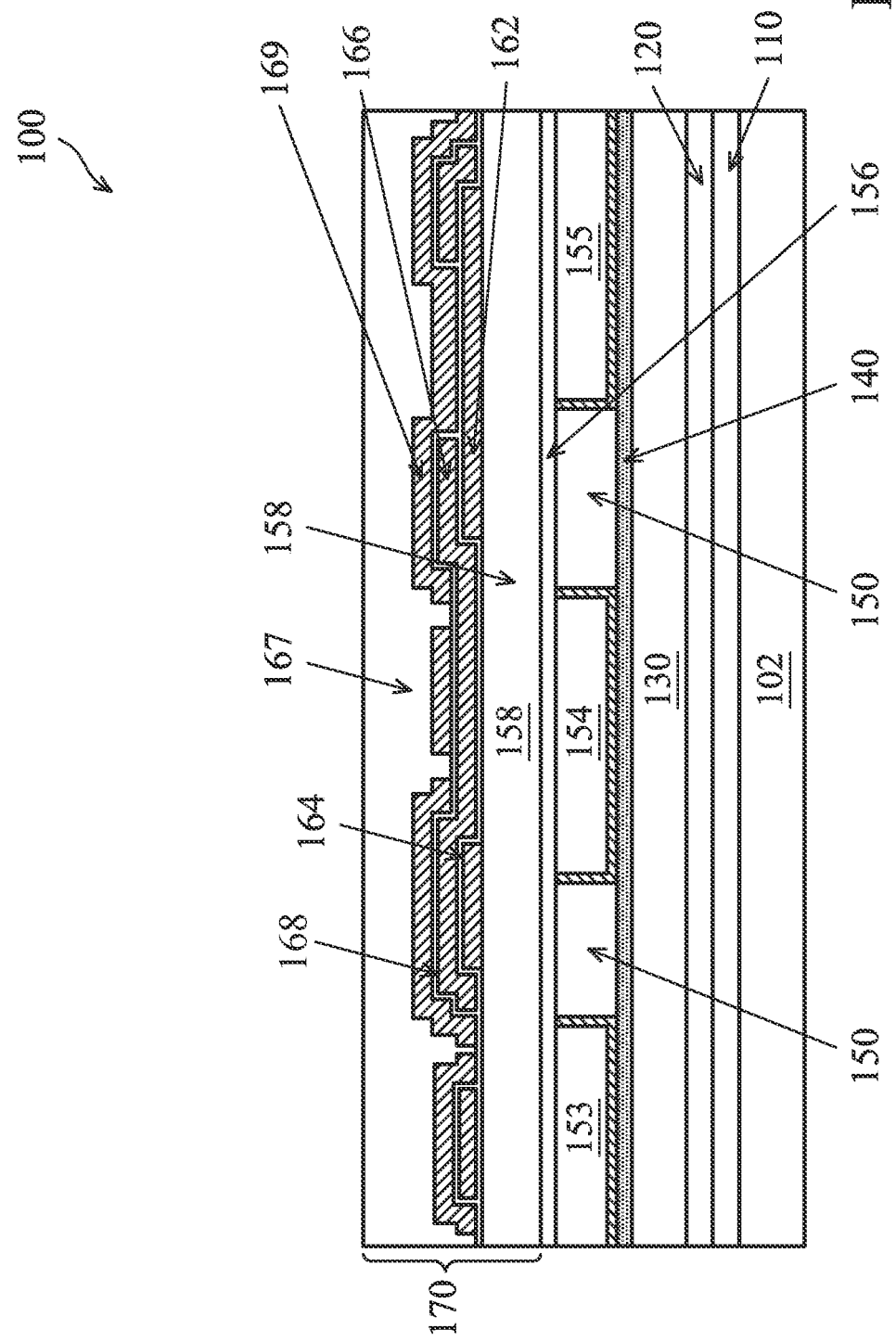

Referring to FIG. 2M, in step 22 of the method 10 (FIG. 1), a dielectric layer 167 is formed over the MIM structure 160. In some embodiments, the dielectric layer 167 is about 400 to about 500 nm thick. The dielectric layer 158 may include an oxide material, such as undoped silicon dioxide, or other suitable material(s). In some embodiments, the dielectric layer 167 is formed by depositing about 900 to about 1000 nm of the oxide material, followed by a CMP process to reach the final thickness. As shown in FIG. 2M, the MIM structure 160 is sandwiched between two dielectric layers 158 and 167, which may have the same material and/or the same thickness. In some embodiments, the nitride layer 156, the dielectric layer 158, the MIM structure 160, and the dielectric layer 167 are regarded as parts of a first multi-layer passivation structure 170. Alternatively, if the MIM structure 160 is not present in the passivation structure 170, the lower dielectric layer 158 and the upper dielectric layer 167 may be combined as a single dielectric layer (e.g., about 900 to about 1100 nm thick) over the nitride layer 156.

Referring to FIG. 2N, in step 24 of the method 10 (FIG. 1), one or more openings (such as 171, 172, and 173) are formed to penetrate through, from top to bottom, the dielectric layer 167, the MIM structure 160, the dioxide layer 158, and the nitride layer 156. The openings 171, 172, and 173 expose top surfaces of the contact features 153, 154, and 155, respectively. In some embodiments, a dry etching process is performed to form the openings 171, 172, and 173. Depending on the application, the sidewall of each opening may expose different metal layers of the MIM structure 160. As shown in FIG. 2N, the openings 171 and 172 both expose the CMM 166 and the CTM 169, while the opening 173 exposes the CBM 162 and the CTM 169.

Figure 2O:
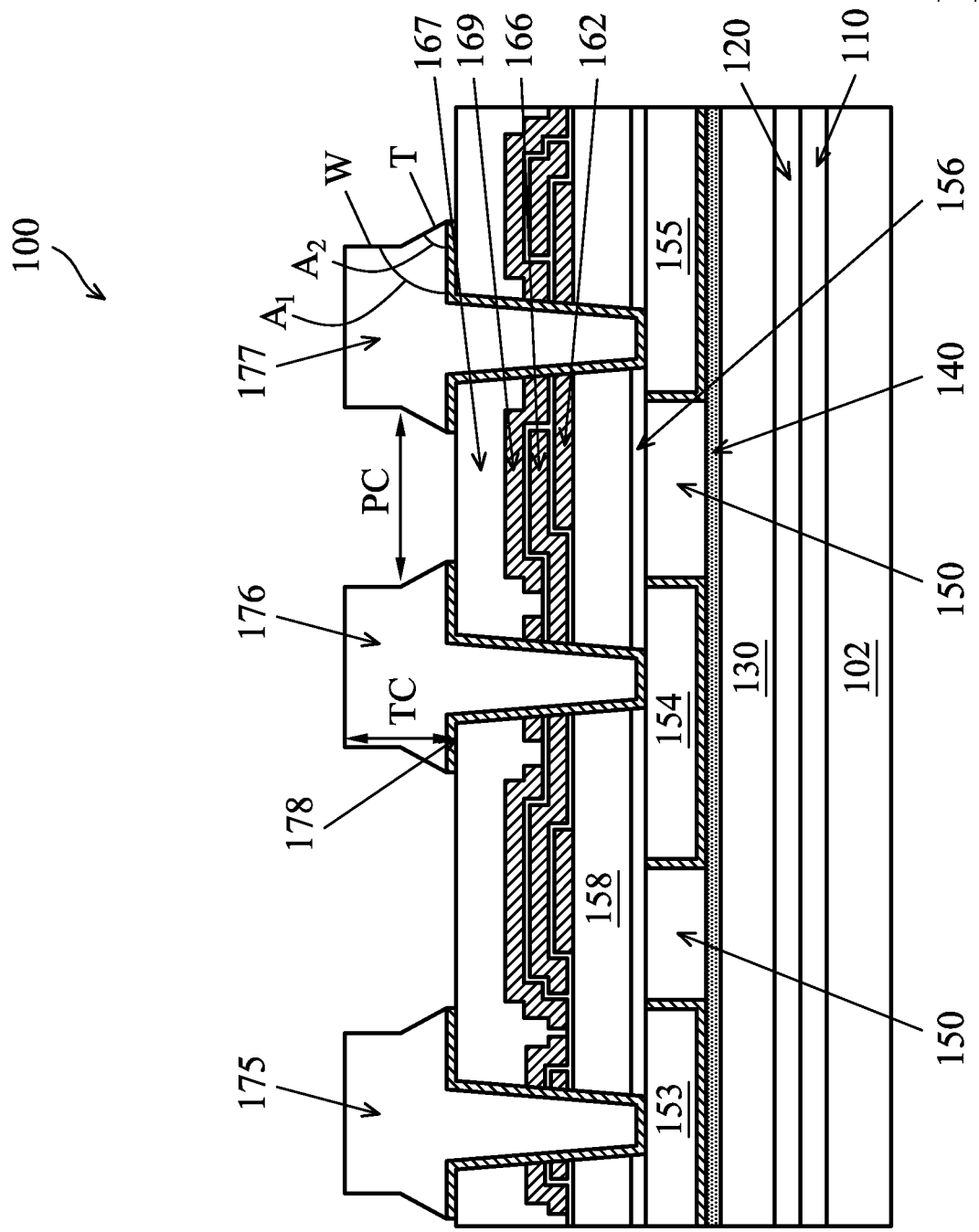

Referring to FIG. 2O, in step 26 of the method 10 (FIG. 1), one or more upper contact features (such as 175, 176, and 177) are formed in and over the openings 171, 172, and 173, respectively. The upper contact features 175, 176, and 177 may also be referred to as metal contacts, metal vias, or metal lines. In some embodiments, to form the one or more contact features (such as 175, 176 and 177), a barrier layer 178 is first conformally deposited over the dielectric layer 167 and into the openings 171, 172 and 173 using a suitable deposition technique, such as ALD, PVD or CVD and then a metal fill layer is deposited over the barrier layer 178 using a suitable deposition technique, such as ALD, PVD or ALD. The deposited barrier layer 178 and the metal fill layer are then patterned to form metal contact or metal lines 175, 176 and 177, as illustrated in the example in FIG. 2O. In some embodiments, the barrier layer 178 and the metal fill layer are patterned in a two-stage or multiple-stage etch process. The two-stage or multiple-stage etch process may include at least one anisotropic etch process step and one isotropic etch process step such that sidewalls of the contact features 175, 176, and 175 include a straight wall section W and a tapered taper section T. In some implementations, the anisotropic etch process step etches faster than the isotropic etch process step and requires more energy. In the embodiment represented in FIG. 2O, the wall section W forms a substantially 90-degree angle A1 with a top surface of the dielectric layer 167 and the tapered section T forms a less-than-90-degree angle A2 with the top surface of the dielectric 167. In some instances, A1 is between about 85° and about 90° and A2 is between about 70° and about 85°. The taper section T allows the contact features 175, 176 and 177 to include a tapered footing profile to reduce stress concentrated at corners of the contact features. Such stress may give rise to cracks that may propagate downward through the dielectric layer 167, threatening the integrity of the MIM structure 160.

At least the upper portion of the contact features 175, 176, and 177 belongs to a redistribution layer (RDL) as the contact features 175, 176, and 177 reroute bond connections between upper and lower layers. The upper contact features 175, 176, and 177 each penetrate through, from top to bottom, the dielectric layer 167, the MIM structure 160, the dioxide layer 158, and the nitride layer 156. The upper contact features 175, 176, and 177 make electrical contact with the lower contact features 153, 154, and 155, respectively. The upper contact features 175, 176, and 177 are considered RDL contacts as they reroute bond connections (e.g., connecting a bonding pad 190 to the lower contact features 153, 154, and 155). Similar to the lower contact features 153, 154, and 155, the upper contact features 175, 176, and 177 may each include a barrier layer and a metal fill layer, which are formed using multiple processes. In some embodiments, the upper contact features 175, 176, and 177 are each about 2500 to about 3100 nm thick. Depending on the application, the sidewall of each upper contact feature may connect to different metal layers of the MIM structure 160. As shown in FIG. 2O, the upper contact features 175 and 176 both connect the CMM 166 and the CTM 169, while the upper contact features 177 connects the CBM 162 and the CTM 169. Since the MIM structure 160 may be used to realize capacitors arranged in various patterns, the contact features 175, 176, and 177 may or may not be electrically connected to the MIM structure 160. For instance, alternative to FIG. 2O, the MIM structure 160 may not have any components directly above the contact feature 153, in which case the contact features 175 is not electrically connected to the MIM structure 160.

As shown in FIG. 2O, each of the contact features 175, 176, and 177 has an upper portion located above the dielectric layer 167 (e.g., the thickness of the upper portion of contact feature 176 is denoted as Tc). The contact features 175, 176, and 177 also have pitch distances between them (e.g., the pitch distance between the contact features 176 and 177 is denoted as Pc). In some embodiments, one or more of the contact features 175, 176, and 177 has a thickness-to-pitch ratio that is equal to or greater than about 1:1 (e.g., between about 1:1 to about 3:1). Such a ratio range is possible because of the use of a multi-layer passivation structure 180, which is described below.

Figure 2P:
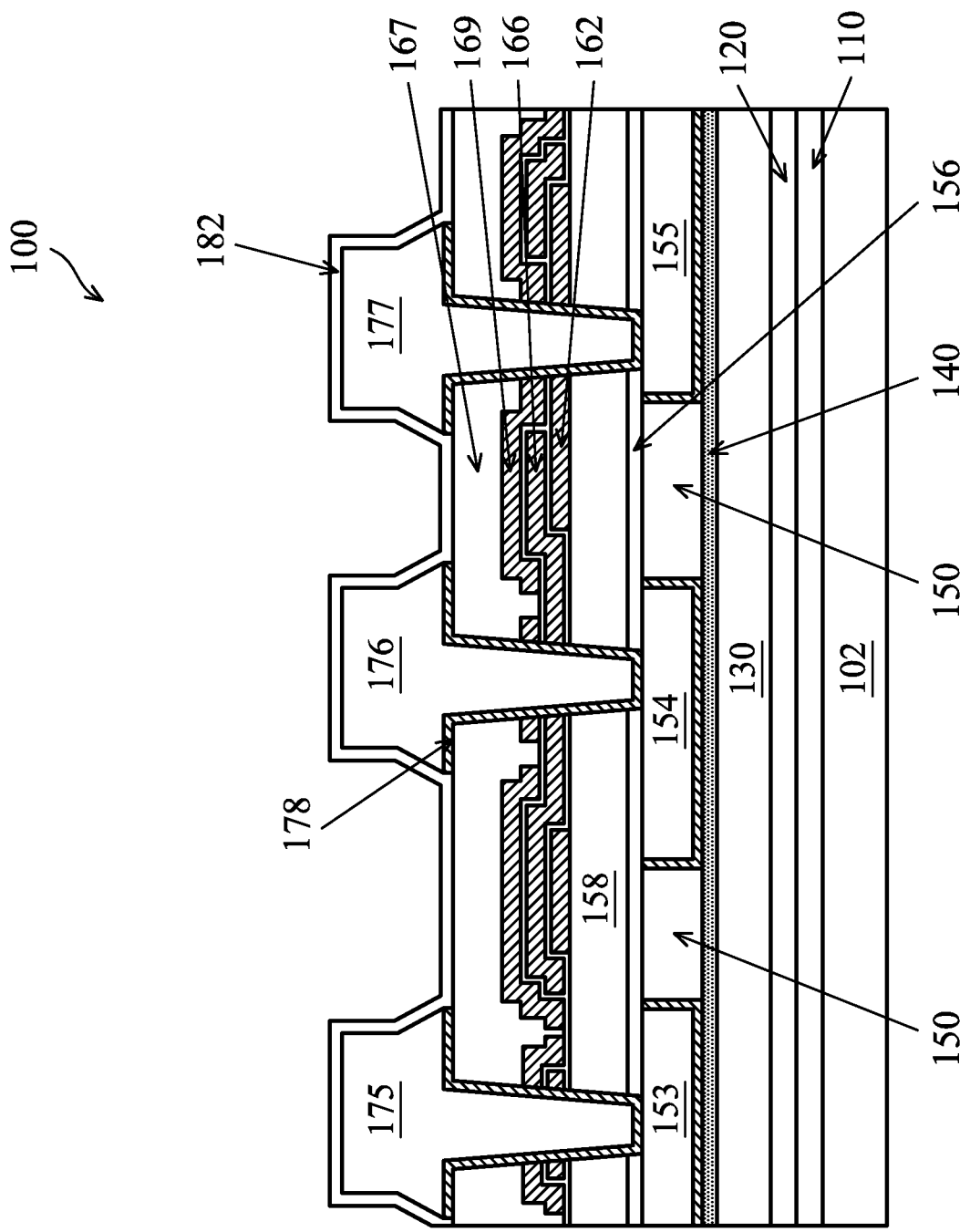
Figure 2Q:
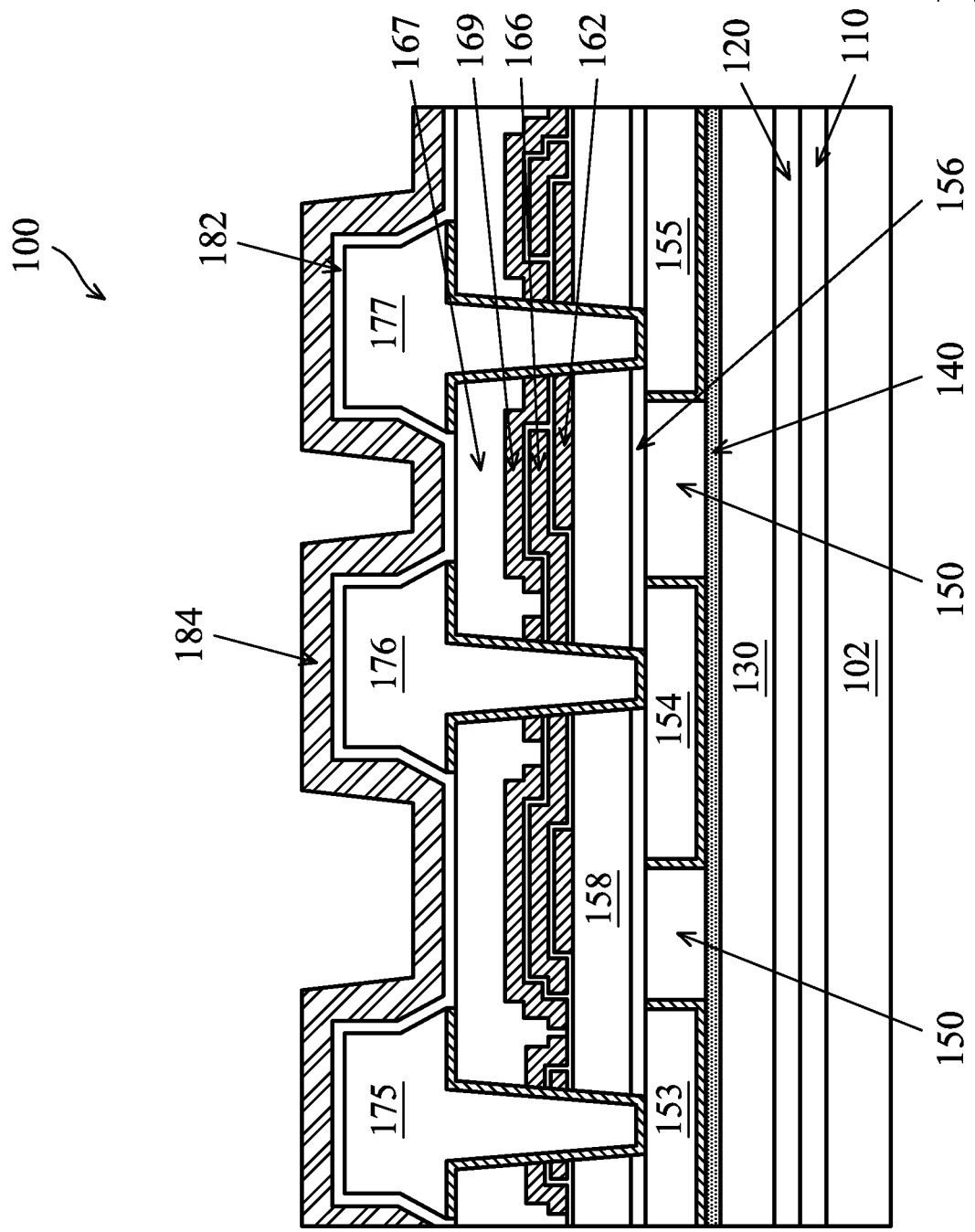
Figure 2R:
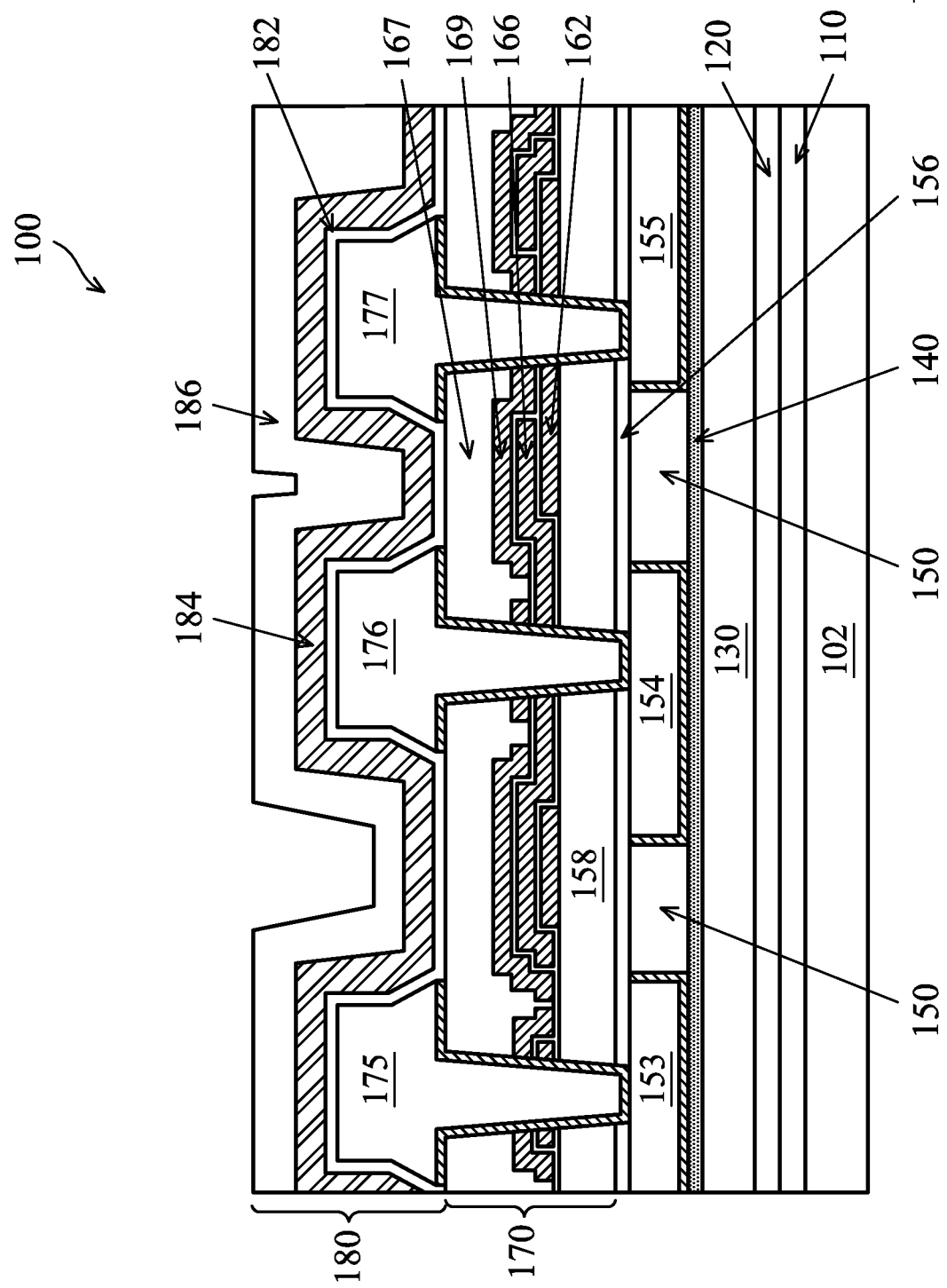

In step 28 of the method 10 (FIG. 1), a multi-layer passivation structure 180 is formed over upper contact features 175, 176, and 177 and over the dielectric layer 167. Referring to FIGS. 2P-2R, forming the passivation structure 180 involves multiple processes. As shown in FIG. 2P, a first nitride (e.g., SiN) layer 182 is formed over the semiconductor device 100. The nitride layer 182 may be formed using suitable methods such as chemical vapor deposition (CVD) or physical vapor deposition (PVD). In an embodiment, the nitride layer 182 is deposited to have a generally uniform thickness over the top surface of the semiconductor device 100 (e.g., having about the same thickness on top and sidewall surfaces of the contact features 175, 176, and 177). In some embodiments, the nitride layer 182 is about 20 to about 250 nm thick.

As shown in FIG. 2Q, an oxide layer 184 is formed over the nitride layer 182. The oxide layer 184 may be formed using suitable methods such as high density plasma (HDP) deposition. In some embodiments, the oxide layer 184 formed using HDP deposition has a Young's modulus between about 62 GPa and about 76 GPa and a coefficient of thermal expansion (CTE) between about 0.45 ppm/° C. and about 0.55 ppm/° C. In an embodiment, the oxide layer 184 is deposited to have a generally uniform thickness over the top surface of the semiconductor device 100 (e.g., having about the same thickness on top and sidewall surfaces of the nitride layer 182). In some embodiments, the oxide layer 184 includes undoped silicon dioxide and is about 1100 to about 1500 nm thick.

As shown in FIG. 2R, a second nitride (e.g., SiN) layer 186 is formed over the oxide layer 184. The nitride layer 186 may be formed using suitable methods such as CVD or PVD. In an embodiment, the nitride layer 186 is deposited to have a generally uniform thickness over the top surface of the semiconductor device 100 (e.g., having about the same thickness on top and sidewall surfaces of the oxide layer 184). In some embodiments, the nitride layer 186 is about 600 to about 800 nm thick.

After formation, the passivation structure 180 has at least three layers including, from bottom to top, the nitride layer 182, the oxide layer 184, and the nitride layer 186. Materials for the nitride layer 182, the oxide layer 184, and the nitride layer 186 are selected such that the oxide layer 184 would have a lower (in some cases significantly lower) Young's Modulus than either the nitride layer 182 or the nitride layer 186. A lower Young's Modulus means that the oxide layer 184 is less brittle and thus more stress resistant. In an embodiment, the nitride layers 182 and 186 include silicon nitride (Young's Modulus of about 310 GPa), and the oxide layer 184 includes undoped silicon dioxide (Young's Modulus of about 69 GPa). Due to the different properties of the multiple layers (due to materials and process conditions), the passivation structure 180 leads to various benefits such as voiding/mitigating damages from potential cracks and increasing its allowable thickness. Benefits of the passivation structure 180 are described further below with respect to FIG. 2U.

Figure 2S:
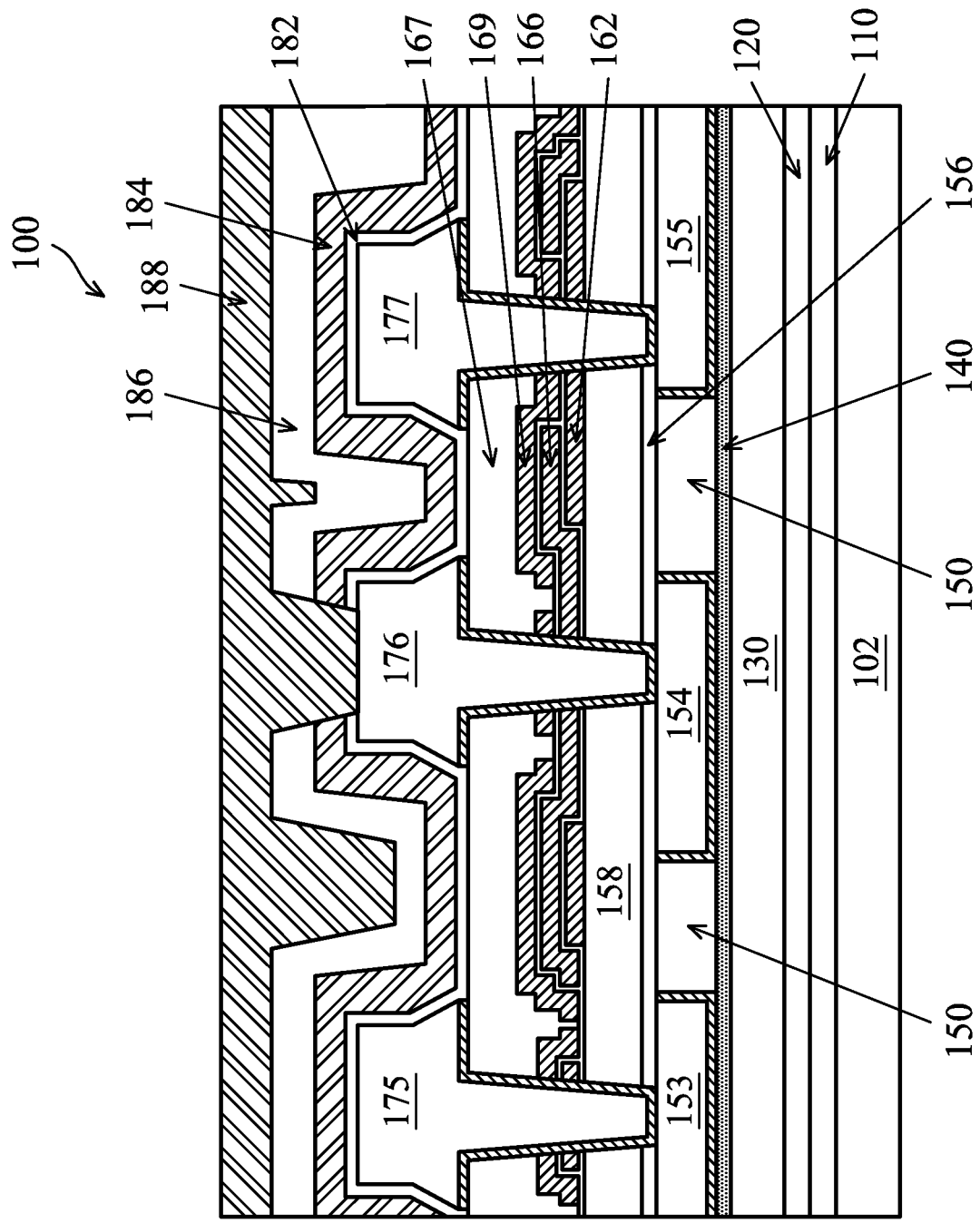

Referring to FIG. 2S, in step 30 of the method 10 (FIG. 1), a material layer 188 is formed over the passivation structure 180. The material layer 188 may be formed of polyimide or polyimide-based materials and may have a Young's modulus between about 3.0 GPa and about 5.5 GPa and a coefficient of thermal expansion (CTE) between about 20 ppm/° C. and about 50 ppm/° C. As shown in FIG. 2S, the material layer 188 nicely fills trench features in the nitride layer 186 without any bottleneck or voids problems.

Figure 2T:
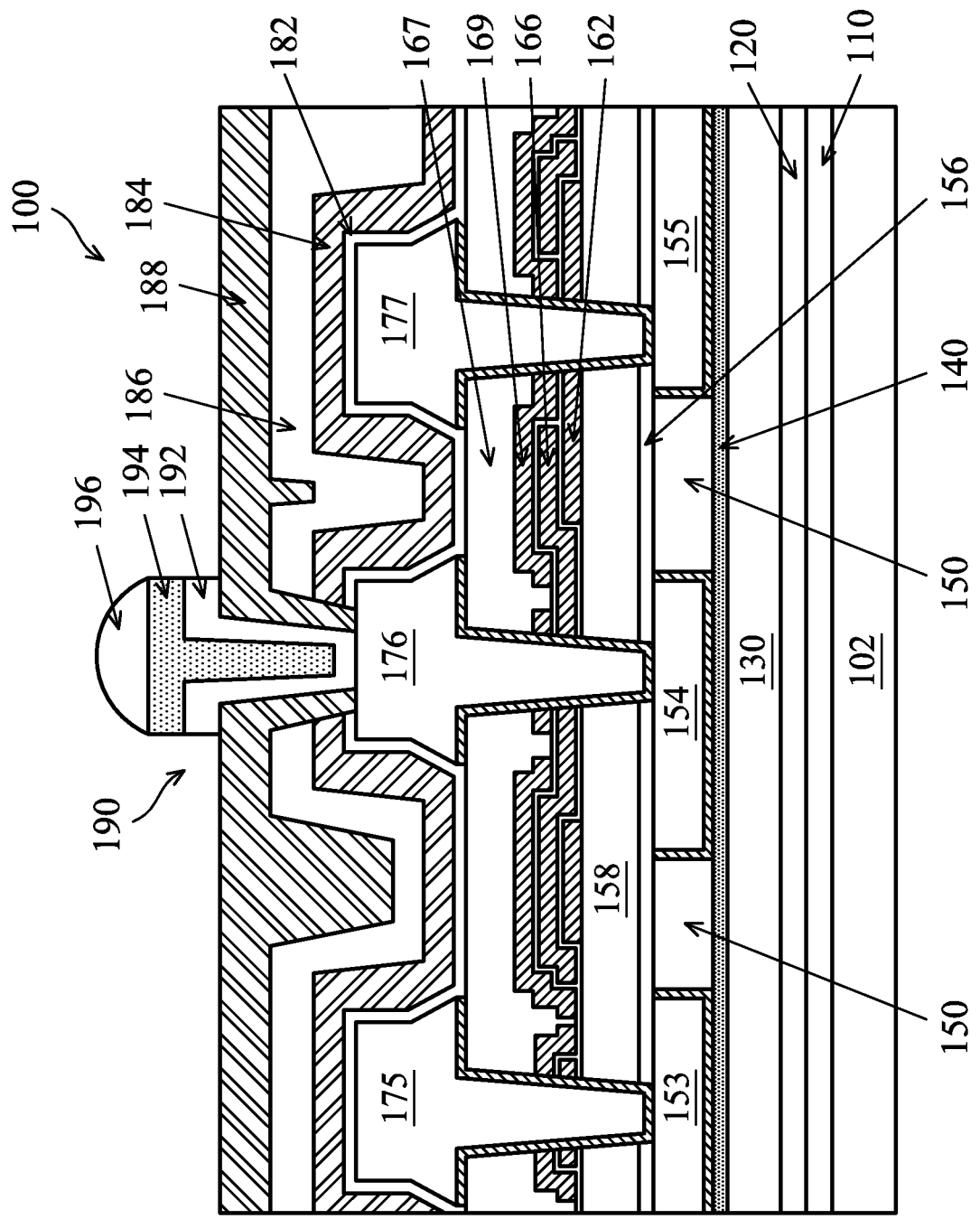

Referring to FIG. 2T, in step 32 of the method 10 (FIG. 1), a bonding pad 190 is formed in the material layer 188 to electrically connect to the upper contact feature 176. The bonding pad 190 includes multiple layers, and its formation involves multiple processes. In some embodiments, an opening is first created in the material layer 188. An under bump metal (UBM) layer 192 is deposited into the opening, and then a bump layer 194 (e.g., made of copper) is deposited on the UBM layer 192. A solder layer 196 is then formed on the bump layer 194 as a point of connection to external circuitry.

As discussed above, some passivation layers disposed on an RDL contain only brittle materials and therefore are prone to cracks under stress. Further, when the RDL includes contact features, the thickness of the single passivation layer on the RDL is also limited, since an overly thick passivation layer (during its formation) may lead to bottle neck and voids in the space between adjacent contact features. Consequently, the space between adjacent metal contacts cannot exceed a certain aspect ratio. This limits the minimal pitch distance between metal contacts, which in turn limits routing density of the RDL. Further, a thin passivation layer may induce passivation crack and therefore damage a metal-insulator-metal (MIM) structure, which functions as capacitors underneath the RDL.

Figure 2U:
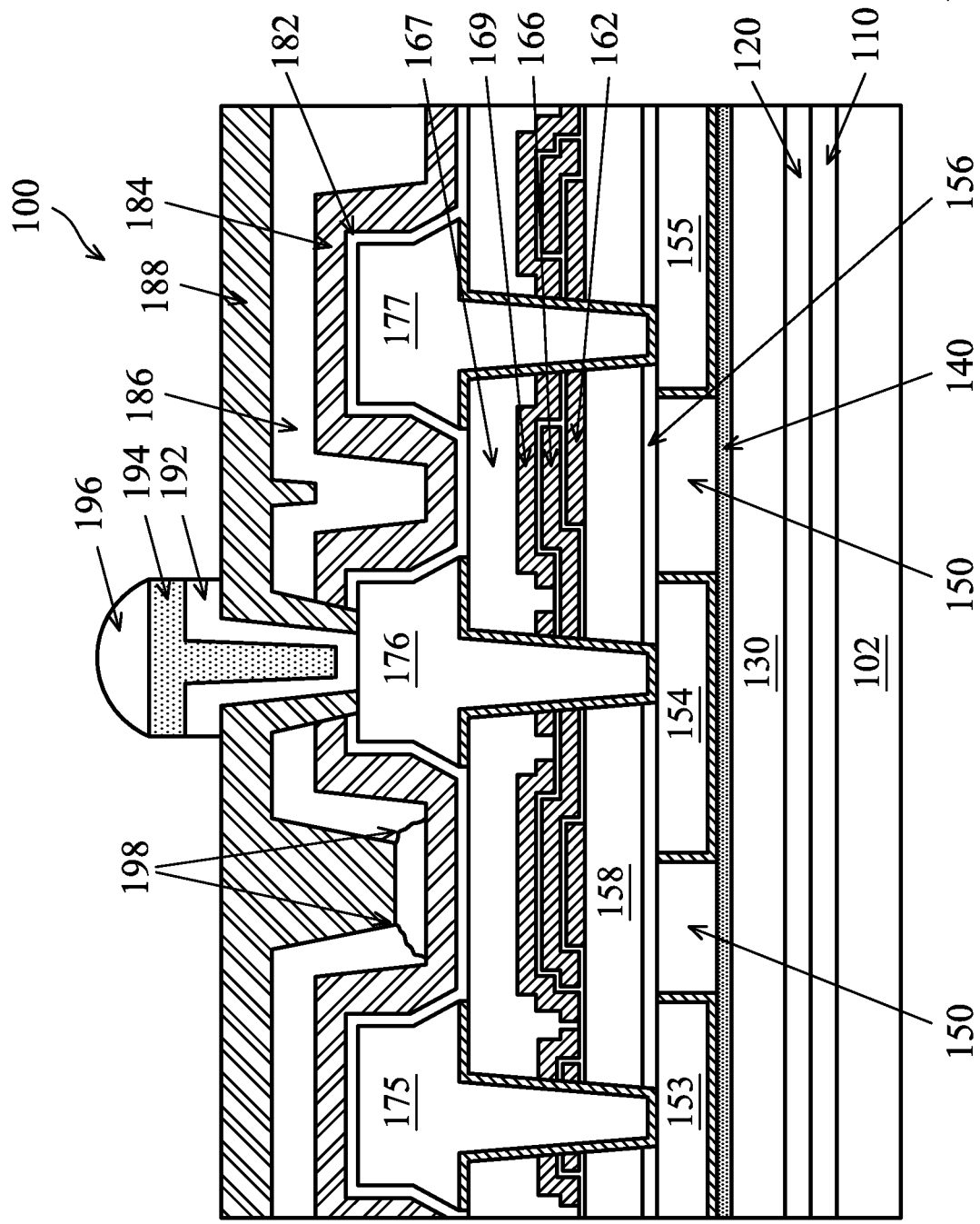

The present disclosure provides a multi-layer passivation structure that addresses these issues and leads to various benefits. In some embodiments, instead of having a single layer, the passivation structure 180 has at least three layers, for example, including two nitride layers 182 and 186 as well as an oxide layer 184 sandwiched between the nitride layers 182 and 186. Due to its lower Young's Modulus, the oxide layer 184 is less brittle than a nitride layer. Therefore, the oxide layer 184 is more resistant to stress (e.g., having a residual stress of −150 MPa, compared to a residual stress of −154 MPa). In the event one or more cracks (such as cracks 198 in corners of the nitride layer 186, as illustrated in FIG. 2U) do occur either during fabrication or during use, the cracks 198 at most can only penetrate through the nitride layer 186 because the oxide layer 184 can act like a sponge to absorb the stress and therefore effectively protect the cracks 198 from spreading or penetration beyond the nitride layer 186. Consequently, a crack is less likely to penetrate through the thickness of the passivation layer to impact underlying electrical components. For example, the oxide layer 184 protect potential cracks from reaching to the MIM structure 160 (as does the underlying nitride layer 182 because it acts as another buffer between the potential cracks and the MIM structure 160). When the MIM structure 160 is a super high density (SHD) structure, it may be relatively close to the bottom of the passivation structure 180, in which case the extra protection is valuable.

Further, the passivation structure 180 disclosed herein allows an overall greater thickness compared to a single-SiN-layer passivation structure. In an embodiment, the first nitride layer 182 has a thickness between 20 to 250 nm, the oxide layer 184 has a thickness between 1100 to 1500 nm, and the second nitride layer 186 has a thickness between 600 to 800 nm. In some embodiments, a total thickness of the passivation structure 180 is about 1500 to about 3000 nm. As described above, due to the use of the passivation structure 180, the contact features 175, 176, and 177 may achieve a thickness-to-pitch ratio that is equal to or greater than about 1:1 (e.g., between about 1:1 to about 3:1). Such a ratio range is obtainable because, for example, the fabrication of the passivation structure 180 prevents potential voids and bottle necks between adjacent contact features. The high thickness-to-pitch ratio allows smaller pitch distances between metal contacts, which in turn increases routing density of the RDL in which the contact features 175, 176, and 177 are distributed. Moreover, in the passivation structure 180, the thickness of each layer is designed to optimize the performance of the passivation structure 180, such as its ability to prevent cracks from happening and/or from spreading. As an example, the oxide layer 184 is the thickest of the three layers to ensure any potential cracks in the above layers (e.g., in the layer 186) does not extend to layers below the oxide layer 184.

Based on the above discussions, it can be seen that the present disclosure offers advantages over conventional devices and the fabrication thereof. It is understood, however, that other embodiments may offer additional advantages, and not all advantages are necessarily disclosed herein, and that no particular advantage is required for all embodiments.

One aspect of the present disclosure involves a method for integrated circuit (IC) fabrication. The method includes forming a passivation layer over a first contact feature, forming a second contact feature over and through the passivation layer to electrically connect to the first contact feature, and forming a multi-layer passivation structure over the second contact feature and over the passivation layer. The passivation layer includes a dielectric layer. Forming the multi-layer passivation structure includes depositing a first nitride layer, an oxide layer over the first nitride layer, and a second nitride layer over the oxide layer.

In some embodiments, the oxide layer is deposited using high density plasma (HDP) deposition. In some embodiments, the first and second nitride layers include silicon nitride and are deposited using chemical vapor deposition (CVD) or physical vapor deposition (PVD). In some implementations, the first nitride layer, the oxide layer, and the second nitride layer are deposited such that the oxide layer has a lower Young's Modulus than either the first nitride layer or the second nitride layer. In some instances, the first and second nitride layers include silicon nitride, the oxide layer includes undoped silicon dioxide, and the second contact feature includes copper. In some embodiments, the multi-layer passivation structure is formed such that the first nitride layer is about 20 to about 250 nm thick, the oxide layer is about 1100 to about 1500 nm thick, and the second nitride layer is about 600 to about 800 nm thick. In some implementations, the dielectric layer is an upper dielectric layer of the passivation layer. The passivation layer is formed to further include a metal-insulator-metal (MIM) structure under the upper dielectric layer as well as a lower dielectric layer under the MIM structure. In some examples, the passivation layer is formed such that its MIM structure includes a plurality of layers including a capacitor bottom metal (CBM), a capacitor middle metal (CMM), a capacitor top metal (CTM), a first high-K dielectric layer disposed between the CBM and the CMM, and a second high-K dielectric layer disposed between the CMM and the CTM, and wherein at least one of the CBM, CMM, and CTM is electrically connected to the first contact feature via the second contact feature. In some instances, the method of the present disclosure further includes forming a bonding pad electrically connected to the second contact feature. In some embodiments, the forming of the bonding pad includes forming, from bottom to top, an under bump metal (UBM) layer, a bump layer, and a solder layer.

One aspect of the present disclosure involves a semiconductor device. The semiconductor device includes a lower contact feature disposed over a substrate, a dielectric layer disposed over the lower contact feature; an upper contact feature disposed over and through the dielectric layer to be electrically connected to the lower contact feature, and a passivation structure disposed over the second contact feature and over the dielectric layer. The passivation structure includes a first nitride layer, a second nitride layer, and an oxide layer disposed between the first and second nitride layers.

In some embodiments, the lower contact feature and the upper contact feature both include copper. In some embodiments, the oxide layer has a lower Young's Modulus than either the first nitride layer or the second nitride layer. In some implementations, the first and second nitride layers include silicon nitride, and the oxide layer includes undoped silicon dioxide. In some instances, the first nitride layer is about 20 to about 250 nm thick, the oxide layer is about 1100 to about 1500 nm thick, and the second nitride layer is about 600 to about 800 nm thick. In some embodiments, the semiconductor device further includes a metal-insulator-metal (MIM) structure disposed between the lower contact feature and the dielectric layer. The MIM structure includes a capacitor bottom metal (CBM), a capacitor middle metal (CMM), a capacitor top metal (CTM), a first dielectric layer disposed between the CBM and the CMM, and a second dielectric layer disposed between the CMM and the CTM.

At least one of the CBM, CMM, and CTM is electrically connected to the upper contact feature. In some examples, the dielectric layer is an upper dielectric layer and the semiconductor device further includes a lower dielectric layer disposed between the lower contact feature and the MIM structure. In some instances, the semiconductor device further includes a bonding pad electrically connected to the upper contact feature. The bonding pad includes, from bottom to top, an under bump metal (UBM) layer, a bump layer, and a solder layer.

Another aspect of the present disclosure involves a method. The method includes forming a top metal (TM) contact over a semiconductor substrate, depositing a first dielectric layer over the TM contact, forming a metal-insulator-metal (MIM) structure over the first dielectric layer, depositing a second dielectric layer over the MIM structure, forming a metal via that is electrically coupled to the MIM structure and to the TM contact, forming a passivation structure over the metal contact and the second dielectric layer, and forming a bonding pad that is electrically coupled to the metal via. Forming the passivation structure includes depositing a first silicon nitride (SiN) layer over the metal via and the second dielectric layer, depositing an oxide layer over the first SiN layer, and depositing a second SiN layer over the oxide layer. In some embodiments, the oxide layer is deposited using high density plasma (HDP) deposition and the first and second nitride layers, which include silicon nitride, are deposited using chemical vapor deposition (CVD) or physical vapor deposition (PVD).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for integrated circuit (IC) fabrication, comprising:
    forming a passivation layer over a first contact feature, the passivation layer comprising:
        a lower dielectric layer over the first contact feature;
        a metal-insulator-metal (MIM) structure over the lower dielectric layer; and
        an upper dielectric layer over the MIM structure;
    forming a second contact feature comprising a first portion over a top surface of the upper dielectric layer and a second portion extending through the passivation layer, the second contact feature being electrically connected to the first contact feature, wherein a sidewall of the first portion and the top surface of the upper dielectric layer form an acute angle; and
    after the forming of the second contact feature, forming a multi-layer passivation structure over the second contact feature and over the passivation layer.

2. The method of claim 1, wherein the multi-layer passivation structure comprises:
    a first nitride layer over the second contact feature;
    an oxide layer over the first nitride layer; and
    a second nitride layer over the oxide layer,
    wherein the oxide layer is deposited using high density plasma (HDP) deposition.

3. The method of claim 2, wherein the first and second nitride layers, comprising silicon nitride, are deposited using chemical vapor deposition (CVD) or physical vapor deposition (PVD).

4. The method of claim 2, wherein the first nitride layer, the oxide layer, and the second nitride layer are deposited such that the oxide layer has a lower Young's Modulus than either the first nitride layer or the second nitride layer.

5. The method of claim 4, wherein the first and second nitride layers comprise silicon nitride, the oxide layer comprises undoped silicon dioxide, and the second contact feature comprises copper.

6. The method of claim 2, wherein the multi-layer passivation structure is formed such that the first nitride layer is about 20 to about 250 nm thick, the oxide layer is about 1100 to about 1500 nm thick, and the second nitride layer is about 600 to about 800 nm thick.

7. The method of claim 1, wherein the passivation layer is formed such that its MIM structure includes a plurality of layers including a capacitor bottom metal (CBM), a capacitor middle metal (CMM), a capacitor top metal (CTM), a first high-K dielectric layer disposed between the CBM and the CMM, and a second high-K dielectric layer disposed between the CMM and the CTM, and wherein at least one of the CBM, CMM, and CTM is electrically connected to the first contact feature via the second contact feature.

8. The method of claim 1, further comprising forming a bonding pad electrically connected to the second contact feature.

9. The method of claim 8, wherein the forming of the bonding pad comprises forming, from bottom to top, an under bump metal (UBM) layer, a bump layer, and a solder layer.

10. The method of claim 1, wherein the second contact feature comprises a barrier layer and a metal fill layer, wherein the barrier layer is sandwiched between the metal fill layer and the top surface of the upper dielectric layer.

11. A method, comprising:
    forming a top metal (TM) contact over a semiconductor substrate;
    depositing a first dielectric layer over the TM contact;
    forming a metal-insulator-metal (MIM) structure over the first dielectric layer;
    depositing a second dielectric layer over the MIM structure;
    forming an opening in the first dielectric layer and the second dielectric layer to expose the TM contact;
    depositing a metal layer over the second dielectric layer and in the opening;
    after the depositing of the metal layer, patterning the metal layer to form a contact feature that is electrically coupled to the MIM structure and to the TM contact, the contact feature comprising a metal via in the opening and an upper portion over a top surface of the second dielectric layer;
    after the patterning of the metal layer, forming a passivation structure over the contact feature and the second dielectric layer, wherein forming the passivation structure comprises:
        depositing a first silicon nitride (SiN) layer over the contact feature and the second dielectric layer;
        depositing an oxide layer over the first SiN layer; and
        depositing a second SiN layer over the oxide layer; and
    forming a bonding pad that is electrically coupled to the contact feature.

12. The method of claim 11, wherein the oxide layer is deposited using high density plasma (HDP) deposition, and wherein the first and second SiN layers are deposited using chemical vapor deposition (CVD) or physical vapor deposition (PVD).

13. The method of claim 11, wherein the depositing of the metal layer comprises:
conformally depositing a barrier layer over the top surface of the second dielectric layer and in the opening; and
depositing a metal fill layer over the barrier layer.

14. The method of claim 13, wherein the patterning of the metal layer comprises:
using at least one anisotropic etch process and at least one isotropic etch process to etch the metal fill layer and the barrier layer to form the contact feature,
wherein the upper portion of the contact feature comprises a taper section and a straight wall section over the taper section.

15. The method of claim 14,
wherein the taper section and the top surface of the second dielectric layer form a first angle that is between about 70° and about 85°,
wherein the straight wall section and the top surface of the second dielectric layer form a second angle that is between about 85° and about 90°.

16. A method, comprising:
forming a metal contact over a semiconductor substrate;
forming a first passivation structure over the metal contact;
forming an opening through the first passivation structure to expose the metal contact;
forming a contact feature over the opening, wherein a lower portion of the contact feature extends through the first passivation structure and an upper portion of the contact feature is above and in direct contact with a top surface of the first passivation structure, wherein a width of a top surface of the upper portion is smaller than a width of a bottom surface of the upper portion, wherein the upper portion comprises a taper footing profile to reduce stress concentrated at corners of the contact feature; and
after the forming of the contact feature, forming a second passivation structure over the contact feature and the first passivation structure, wherein the second passivation structure comprises a first silicon nitride layer, a silicon oxide layer over the first silicon nitride layer, and a second silicon nitride layer over the silicon oxide layer.

17. The method of claim 16, wherein the forming of the first passivation structure comprises:
depositing a first dielectric layer over the metal contact;
forming a metal-insulator-metal (MIM) structure over the first dielectric layer; and
depositing a second dielectric layer over the MIM structure.

18. The method of claim 16, wherein the forming of the contact feature comprises:
conformally depositing a barrier layer over the opening;
depositing a metal fill layer over the barrier layer; and
patterning the metal fill layer using at least one anisotropic etch process and at least one isotropic etch process to form a contact feature.

19. The method of claim 16, wherein the forming of the second passivation structure comprises:
depositing the first silicon nitride layer using chemical vapor deposition (CVD) or physical vapor deposition (PVD);
after the depositing of the first silicon nitride layer, depositing the silicon oxide layer using high density plasma (HDP) deposition; and
depositing the second silicon nitride layer using CVD or PVD.

20. The method of claim 16, wherein a thickness of the second silicon nitride layer is greater than a thickness of the first silicon nitride layer.

* * * * *